United States Patent
Fukasawa et al.

(10) Patent No.: US 12,517,422 B2
(45) Date of Patent: *Jan. 6, 2026

(54) REFLECTIVE MASK BLANK, REFLECTIVE MASK, AND METHOD OF MANUFACTURING SEMICONDUCTOR DEVICE

(71) Applicant: HOYA CORPORATION, Tokyo (JP)

(72) Inventors: Ikuya Fukasawa, Tokyo (JP); Yohei Ikebe, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 599 days.

This patent is subject to a terminal disclaimer.

(21) Appl. No.: 17/800,154

(22) PCT Filed: Feb. 17, 2021

(86) PCT No.: PCT/JP2021/005881
§ 371 (c)(1),
(2) Date: Aug. 16, 2022

(87) PCT Pub. No.: WO2021/182042
PCT Pub. Date: Sep. 16, 2021

(65) Prior Publication Data
US 2023/0076438 A1    Mar. 9, 2023

(30) Foreign Application Priority Data

Mar. 10, 2020   (JP) ................. 2020-040732

(51) Int. Cl.
*G03F 1/24*   (2012.01)
*G03F 1/52*   (2012.01)

(52) U.S. Cl.
CPC . *G03F 1/24* (2013.01); *G03F 1/52* (2013.01)

(58) Field of Classification Search
None
See application file for complete search history.

(56) References Cited

U.S. PATENT DOCUMENTS 11,531,264 B2 *  12/2022  Ikebe .................. G03F 1/32
11,550,215 B2 *   1/2023  Ikebe .................. G03F 1/24
(Continued)

FOREIGN PATENT DOCUMENTS

JP    2004281967 A  * 10/2004
JP    2011029334 A     2/2011
(Continued)

OTHER PUBLICATIONS

PCT/JP2021/005881, "English Translation of International Search Report", Apr. 13, 2021, 2 pages.
(Continued)

*Primary Examiner* — Martin J Angebranndt
(74) *Attorney, Agent, or Firm* — Sughrue Mion, PLLC

(57) ABSTRACT

Provided is a reflective mask blank.
The reflective mask blank has a multilayer reflective film and a thin film for pattern formation in this order on a main surface of a substrate; the thin film consists of a single layer structure consisting of a ruthenium-containing layer at least containing ruthenium, nitrogen, and oxygen or a multilayer structure including the ruthenium-containing layer; and when the ruthenium-containing layer is subjected to an analysis by an In-Plane measurement of an X-ray diffraction method to obtain an X-ray diffraction profile where, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg is greater than 1.0 and less than 3.0.

19 Claims, 5 Drawing Sheets

(56) References Cited

U.S. PATENT DOCUMENTS

| | | | |
|---|---|---|---|
| 11,815,807 B2* | 11/2023 | Ikebe | G03F 1/24 |
| 11,822,229 B2* | 11/2023 | Akagi | G03F 1/26 |
| 12,105,413 B2* | 10/2024 | Ikebe | G03F 7/20 |
| 12,111,566 B2* | 10/2024 | Ikebe | G03F 1/32 |
| 12,216,397 B2* | 2/2025 | Akagi | H01L 21/0337 |
| 2011/0020737 A1* | 1/2011 | Kamo | G03F 1/24 |
| | | | 430/5 |
| 2012/0021344 A1 | 1/2012 | Matsuo | |
| 2017/0038673 A1 | 2/2017 | Ikebe et al. | |
| 2018/0329285 A1* | 11/2018 | Hamamoto | C03C 17/3441 |
| 2019/0049836 A1 | 2/2019 | Hanekawa et al. | |
| 2021/0208498 A1 | 7/2021 | Ikebe et al. | |
| 2021/0223681 A1 | 7/2021 | Ikebe et al. | |
| 2021/0232039 A1* | 7/2021 | Liu | G03F 1/24 |
| 2022/0390826 A1* | 12/2022 | Ikebe | G03F 1/48 |

FOREIGN PATENT DOCUMENTS

| | | | | |
|---|---|---|---|---|
| JP | 5282507 B2 | 6/2013 | | |
| KR | 10-2016-0101920 A | 8/2016 | | |
| KR | 10-2017-0021191 A | 2/2017 | | |
| KR | 10-2019-0017667 A | 2/2019 | | |
| WO | 2010113700 A1 | 10/2010 | | |
| WO | WO-2018159392 A1 * | 9/2018 | | C23C 14/14 |
| WO | 2019225736 A1 | 11/2019 | | |
| WO | WO-2019225737 A1 * | 11/2019 | | G03F 1/24 |
| WO | WO-2021132111 A1 * | 7/2021 | | G03F 1/24 |

OTHER PUBLICATIONS

Office Action issued Jun. 5, 2025 in Korean Patent Application No. 10-2022-7028389.

\* cited by examiner

[FIG. 1]
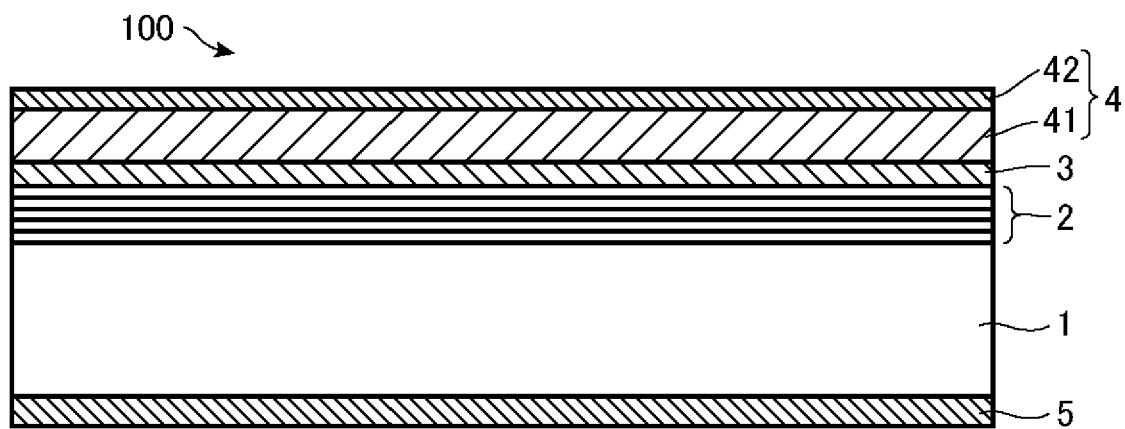
[FIG. 2]
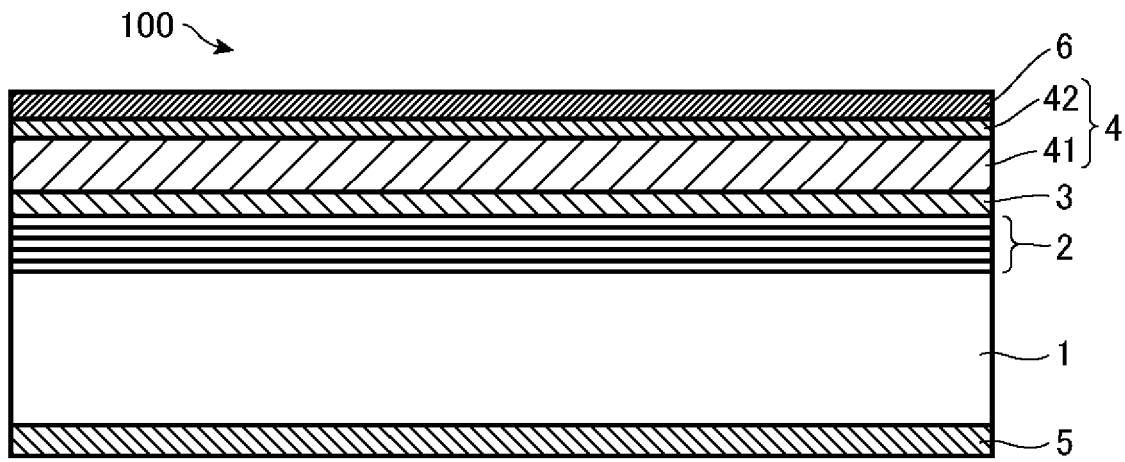

[Fig. 3A]
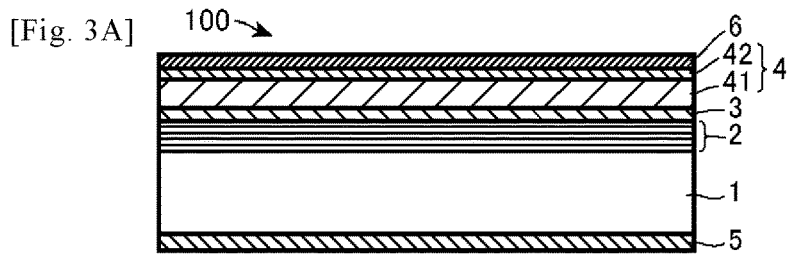
[Fig. 3B]
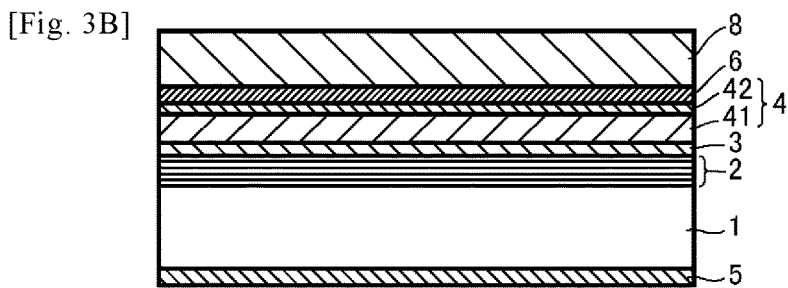
[Fig. 3C]
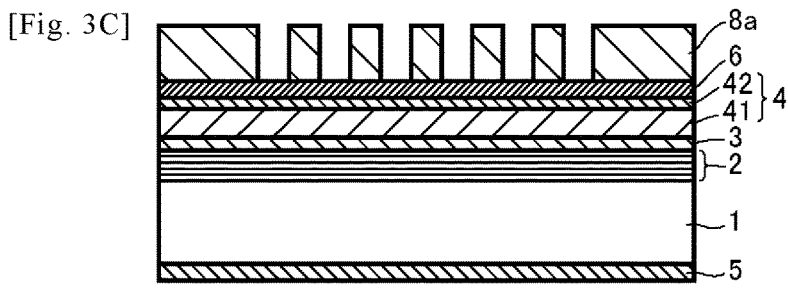
[Fig. 3D]
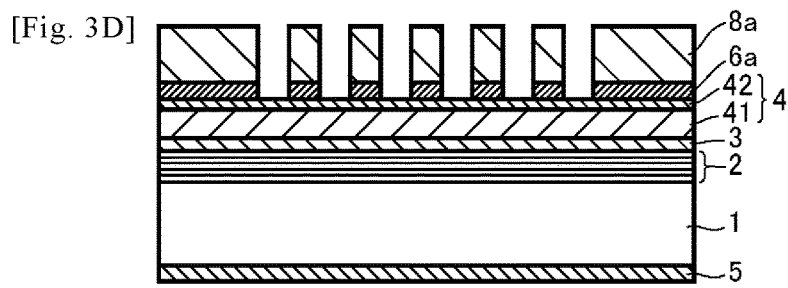
[Fig. 3E]
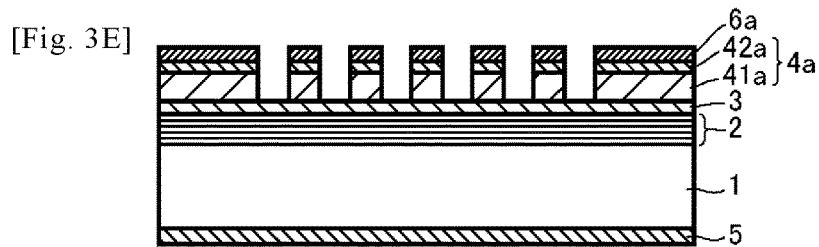
[Fig. 3F]
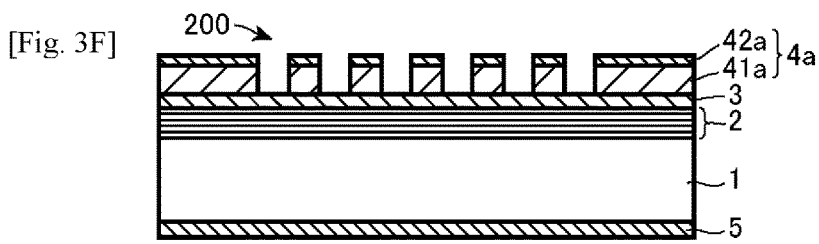

[FIG. 4]
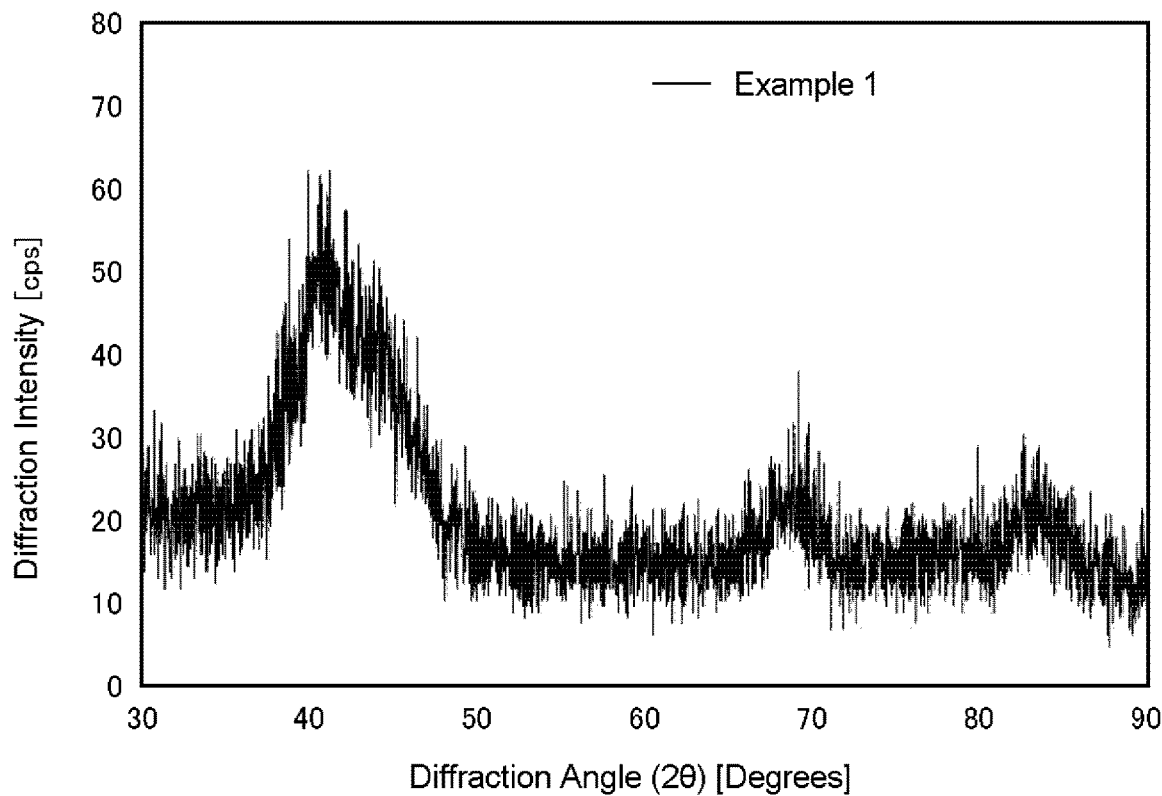
[FIG. 5]
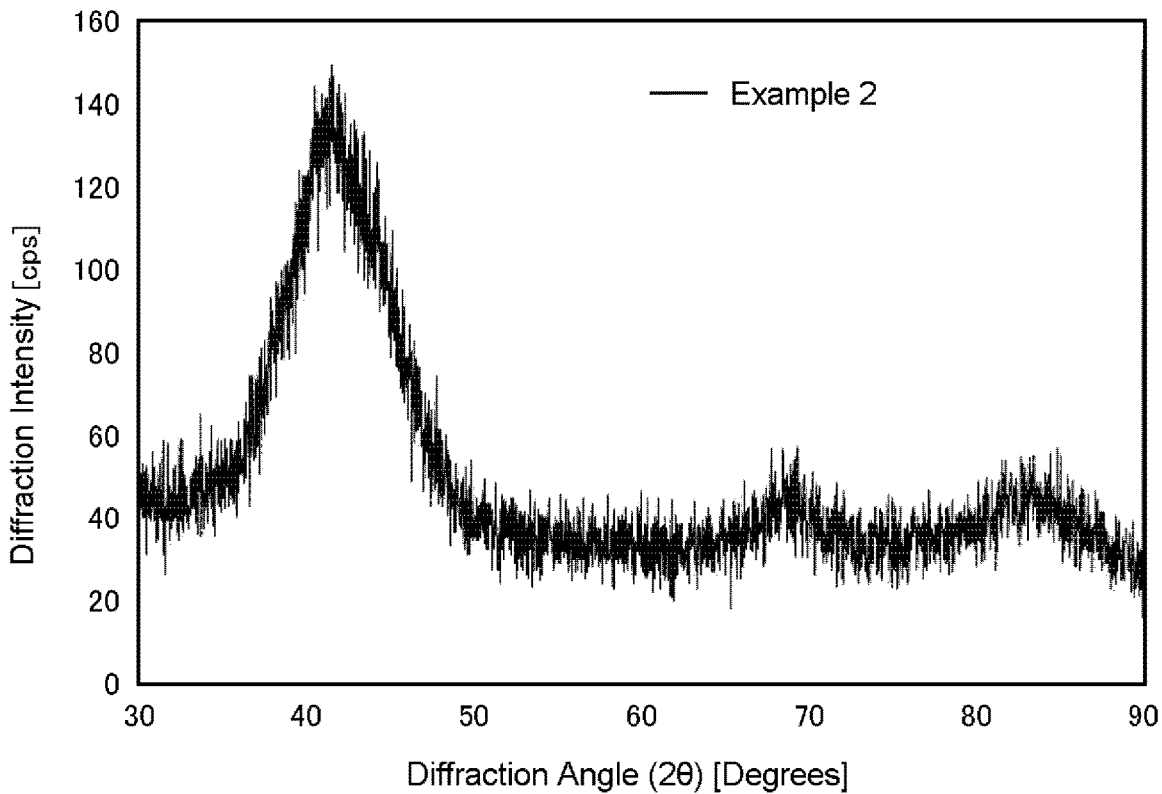

[FIG. 6]
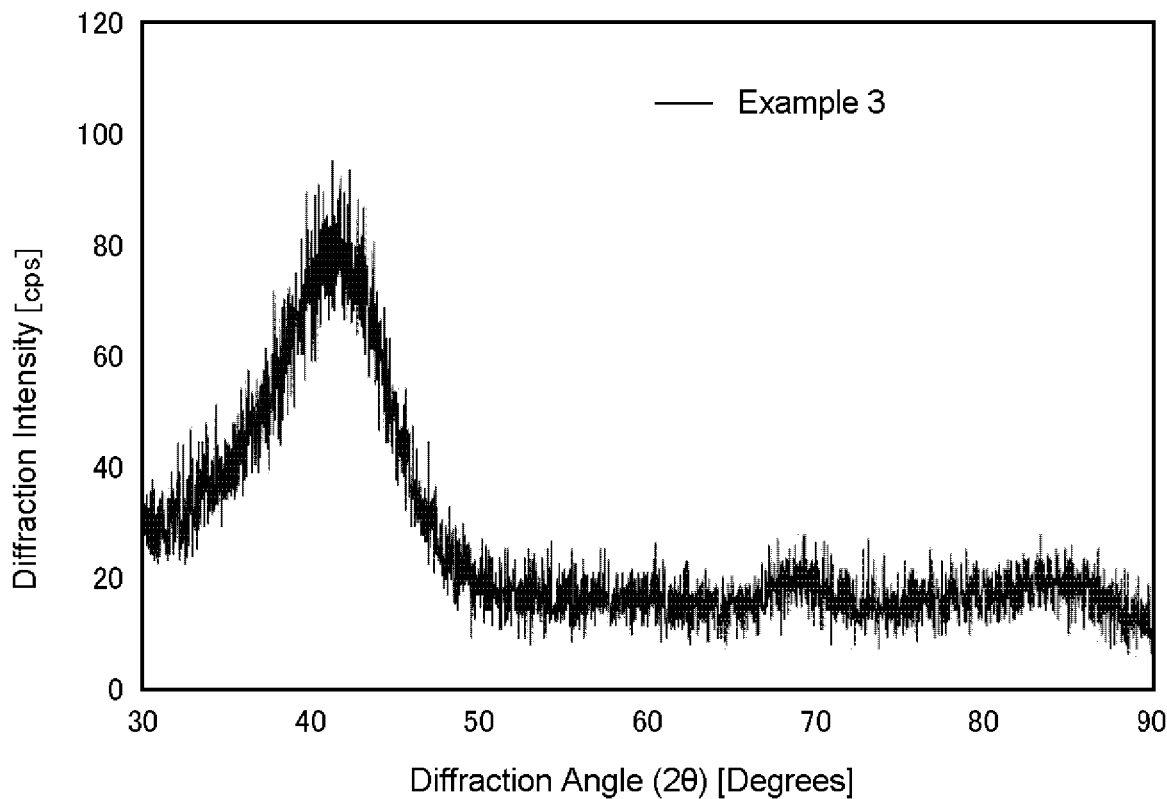
[FIG. 7]
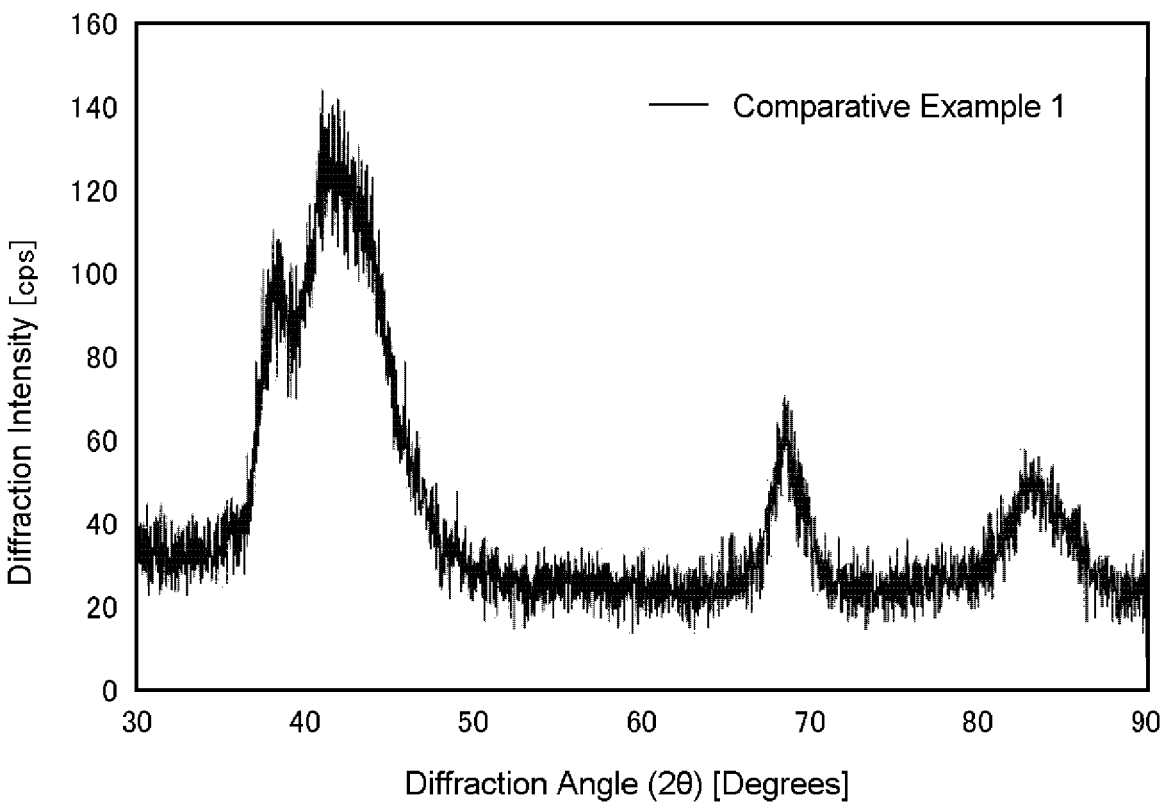

[FIG. 8]
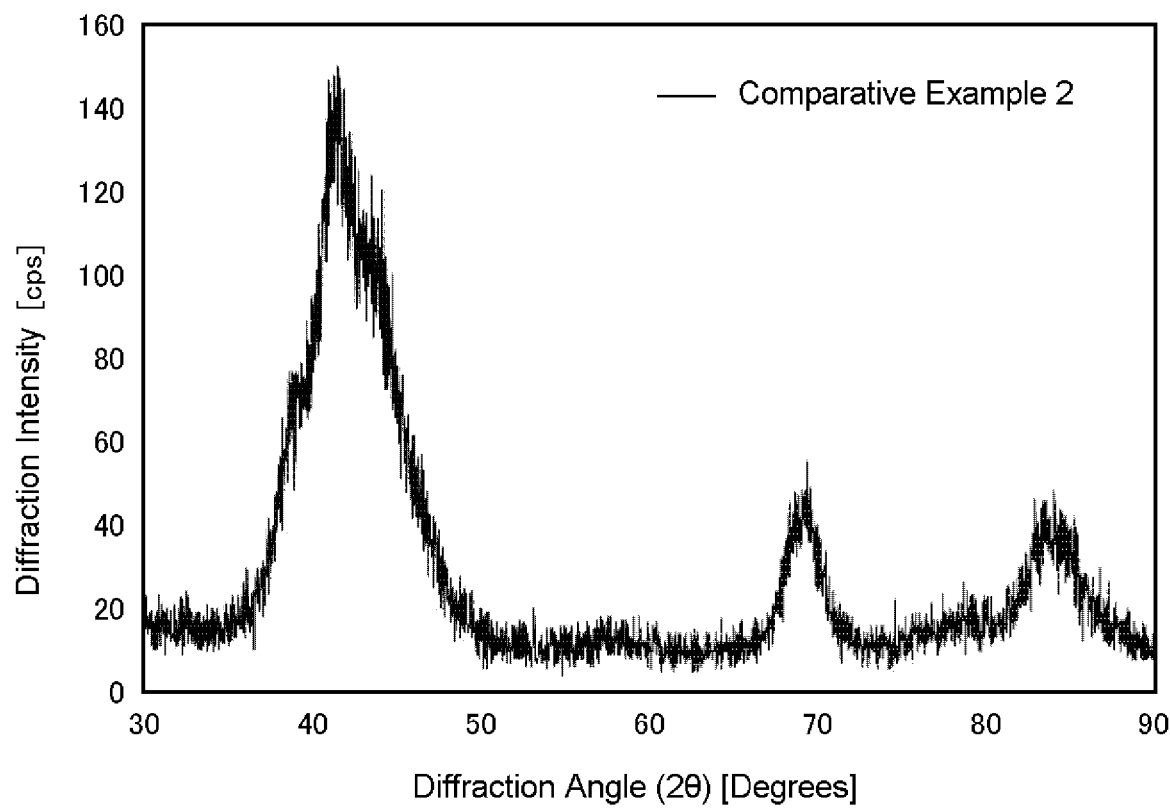

REFLECTIVE MASK BLANK, REFLECTIVE MASK, AND METHOD OF MANUFACTURING SEMICONDUCTOR DEVICE

CROSS-REFERENCE TO RELATED APPLICATIONS

This application is the National Stage of International Application No. PCT/JP2021/005881, filed Feb. 17, 2021, which claims priority to Japanese Patent Application No. 2020-040732, filed Mar. 10, 2020, and the contents of which is incorporated by reference.

TECHNICAL FIELD

The present disclosure relates to a reflective mask blank which is an original form for manufacturing an exposure mask used for manufacturing a semiconductor device, etc., a reflective mask, and a method of manufacturing a semiconductor device.

BACKGROUND ART

An exposure apparatus in manufacturing semiconductor devices has evolved by gradually shortening the wavelength of the light source. In order to realize finer pattern transfer, EUV lithography using an extreme ultraviolet ray (EUV: Extreme Ultra Violet; may hereafter be referred to as EUV light) having a wavelength around 13.5 nm has been developed. In EUV lithography, a reflective mask is used since there are not many materials that are transparent to EUV light. Typical reflective masks include a reflective binary mask and a reflective phase shift mask (reflective halftone phase shift mask). A reflective binary mask has a relatively thick absorber pattern that sufficiently absorbs EUV light. A reflective phase shift mask has a relatively thin absorber pattern (phase shift pattern) that reduces EUV light by optical absorption and generates reflected light that is phase-reversed at a desired angle with respect to reflected light from a multilayer reflective film. A reflective phase shift mask can further improve resolution since the phase shift effect provides high transfer optical image contrast. In addition, the thin film thickness of an absorber pattern (phase shift pattern) of a reflective phase shift mask allows formation of a highly precise, fine phase shift pattern.

A technique related to a reflective mask for such EUV lithography and a mask blank for manufacturing the same is described in Patent Documents 1 and 2.

Patent Document 1 describes a reflective exposure mask including a multilayer reflective film serving as a high-reflection area to exposure light, and an absorber pattern which absorbs exposure light and serves as a low-reflection area to the exposure light. Patent Document 1 further describes that the phase difference between the reflected light of the exposure light from the multilayer reflective film and the reflected light of the exposure light from the absorber pattern is within 180 degrees±10 degrees. Furthermore, Patent Document 1 describes using, as an absorber pattern, a single-layer absorber pattern formed of a Ru film containing Ru as a main component, or a multilayer absorber pattern formed of stacked films of a Ru film and a Cr film which is thinner than the Ru film and containing Cr as a main component. In addition, Patent Document 1 describes, as materials for the Ru film containing Ru as a main component, using CrRu alloy and CrRuN alloy, for example.

Patent document 2 describes a halftone EUV mask with a substrate, a high reflection part formed on the substrate, and a low reflection part formed on the high reflection part and which is patterned. Patent Document 2 further describes that the low reflection part is a stacked structure of a Ta (tantalum)-containing first layer and a Ru (ruthenium)-containing second layer.

PRIOR ART PUBLICATIONS

Patent Documents

[Patent Document 1]
Japanese Patent Application Publication 2011-29334
[Patent Document 2]
Japan Patent No. 5282507

SUMMARY OF THE DISCLOSURE

Problems to be Solved by the Disclosure

The finer the pattern and the higher the precision of the pattern size and/or the pattern position, the higher the electrical characteristic and performance of the semiconductor device, and the higher the integration degree and the smaller the chip size. Therefore, a pattern transfer performance with a higher level of precision and fine dimension compared to conventional cases is expected for EUV lithography. At present, formation of ultrafine and high-precision patterns corresponding to the hp 16 nm (half pitch 16 nm) generation is required. To cope with these demands, a reflective phase shift mask using EUV light as exposure light and further using the phase shift effect is desired.

In EUV lithography, a projection optical system consisting of numerous reflecting mirrors is used in association with a light transmittance. EUV light is entered obliquely on a reflective mask so that the plurality of reflecting mirrors does not block the projection light (exposure light). The incidence angle is currently generally 6 degrees to a plane perpendicular to a substrate of a reflective mask.

Since exposure light enters obliquely in EUV lithography, there is an inherent problem called the shadowing effect. The shadowing effect is a phenomenon in which a shadow is formed when exposure light enters obliquely on an absorber pattern having a three-dimensional structure, and the size and/or position of the pattern to be transferred changes. The three-dimensional structure of an absorber pattern acts as a wall so that a shadow is formed on the shade side, and the size and/or position of the pattern to be transferred changes. For example, a difference occurs in the size and position of transfer patterns depending on whether the orientation of an absorber pattern to be arranged is parallel or vertical to the direction of the oblique incident light, causing reduction in transfer precision.

In a reflective phase shift mask, there is a demand to reduce the shadowing effect for the requirement of ultra-fine and high-precision pattern formation. For this reason, there is a demand to further reduce the film thickness of an absorber film (phase shift film). However, it is necessary for the phase shift film to have a function to generate a predetermined phase difference to exposure light and also a function to reflect exposure light at a predetermined reflectance.

As a material that can reduce the film thickness while satisfying these optical characteristics, Ru alone or a material containing Ru (hereinafter properly referred to as "Ru-based material") are being considered. A Ru-based material has characteristics that are suitable as a phase shift film for having less refractive index n and extinction coefficient k to EUV light compared to other materials. However, a Ru-based material tends to turn into a crystallized structure and is difficult to process when crystallized. In other words, crystalline particles of a crystallized Ru-based material tend to cause large sidewall roughness when forming a phase shift pattern. This may cause an adverse effect in forming a predetermined phase shift pattern.

An aspect of the present disclosure is to provide a reflective mask blank having a phase shift film of a multi-layer structure that can further reduce crystallinity (further enhance microcrystalline or amorphous property) while satisfying the optical characteristics of the phase shift film.

Further, an aspect of the present disclosure is to provide a reflective mask manufactured using the reflective mask blank, and a method of manufacturing a semiconductor device using the reflective mask.

Means for Solving the Problem

To solve the above problems, the present disclosure includes the following configurations.
(Configuration 1)
A reflective mask blank including a multilayer reflective film and a thin film for pattern formation in this order on a main surface of a substrate,
in which the thin film consists of a single layer structure consisting of a ruthenium-containing layer at least containing ruthenium, nitrogen, and oxygen, or a multilayer structure containing the ruthenium-containing layer,
in which when the ruthenium-containing layer is subjected to an analysis by an In-Plane measurement of an X-ray diffraction method to obtain an X-ray diffraction profile where, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg is greater than 1.0 and less than 3.0.
(Configuration 2)
The reflective mask blank according to Configuration 1, in which the ruthenium-containing layer has more nitrogen content than oxygen content.
(Configuration 3)
The reflective mask blank according to Configuration 1 or 2, in which the ruthenium-containing layer contains chromium.
(Configuration 4)
The reflective mask blank according to any of Configurations 1 to 3, in which an element having the largest content in the ruthenium-containing layer is ruthenium.
(Configuration 5)
The reflective mask blank according to any of Configurations 1 to 4, in which the thin film consists of a multilayer structure including an uppermost layer containing ruthenium on the ruthenium-containing layer.
(Configuration 6)
The reflective mask blank according to Configuration 5, in which an element having the largest content in the uppermost layer is oxygen.
(Configuration 7)
The reflective mask blank according to any of Configurations 1 to 6 including a protective film between the multilayer reflective film and the thin film.

(Configuration 8)
A reflective mask including a multilayer reflective film and a thin film having a transfer pattern in this order on a main surface of a substrate,
in which the thin film consists of a single layer structure consisting of a ruthenium-containing layer at least containing ruthenium, nitrogen, and oxygen, or a multilayer structure containing the ruthenium-containing layer,
in which when the ruthenium-containing layer is subjected to an analysis by an In-Plane measurement of an X-ray diffraction method to obtain an X-ray diffraction profile where, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg is greater than 1.0 and less than 3.0.
(Configuration 9)
The reflective mask according to Configuration 8, in which the ruthenium-containing layer has more nitrogen content than oxygen content.
(Configuration 10)
The reflective mask according to Configuration 8 or 9, in which the ruthenium-containing layer contains chromium.
(Configuration 11)
The reflective mask according to any of Configurations 8 to 10, in which an element having the largest content in the ruthenium-containing layer is ruthenium.
(Configuration 12)
The reflective mask according to any of Configurations 8 to 11, in which the thin film consists of a multilayer structure including an uppermost layer containing ruthenium on the ruthenium-containing layer.
(Configuration 13)
The reflective mask according to Configuration 12, in which an element having the largest content in the uppermost layer is oxygen.
(Configuration 14)
The reflective mask according to any of Configurations 8 to 13 including a protective film between the multilayer reflective film and the thin film.
(Configuration 15)
A method of manufacturing a semiconductor device including the step of transferring a transfer pattern to a resist film on a semiconductor substrate by exposure using the reflective mask according to any of Configurations 8 to 14.

Effect of the Disclosure

According to the present disclosure, in a reflective mask blank having a phase shift film, a phase shift film can be provided which can further reduce crystallinity (further enhance microcrystalline or amorphous property) while satisfying the optical characteristics of the phase shift film.

Further, according to the present disclosure, a reflective mask manufactured using the reflective mask blank, and a method of manufacturing a semiconductor device using the reflective mask can be provided.

BRIEF DESCRIPTION OF THE DRAWINGS

FIG. 1 is a schematic cross-sectional view of a principal portion for explaining an example of a schematic configuration of the reflective mask blank according to an embodiment of the present disclosure.

FIG. 2 is a schematic cross-sectional view of a principal portion for explaining another example of a schematic configuration of the reflective mask blank according to an embodiment of the present disclosure.

FIGS. 3A-3F show the steps of manufacturing the reflective mask from the reflective mask blank in schematic cross-sectional views of a principal portion.

FIG. 4 shows the relationship between the diffraction angle and the diffraction intensity when the phase shift film using the material corresponding to the lower layer of Example 1 was measured by an In-Plane measurement method of an X-ray diffraction analysis.

FIG. 5 shows the relationship between the diffraction angle and the diffraction intensity when the phase shift film using the material corresponding to the lower layer of Example 2 was measured by an In-Plane measurement method of an X-ray diffraction analysis.

FIG. 6 shows the relationship between the diffraction angle and the diffraction intensity when the phase shift film using the material corresponding to the lower layer of Example 3 was measured by an In-Plane measurement method of an X-ray diffraction analysis.

FIG. 7 shows the relationship between the diffraction angle and the diffraction intensity when the phase shift film using the material corresponding to the lower layer of Comparative Example 1 was measured by an In-Plane measurement method of an X-ray diffraction analysis.

FIG. 8 shows the relationship between the diffraction angle and the diffraction intensity when the phase shift film using the material corresponding to the lower layer of Comparative Example 2 was measured by an In-Plane measurement method of an X-ray diffraction analysis.

EMBODIMENTS FOR CARRYING OUT THE DISCLOSURE

The embodiment of the present disclosure is explained below. First, the background of the present disclosure is explained. The inventors diligently studied means by which crystallinity can be further reduced while satisfying the optical characteristics for EUV light with respect to a phase shift film including a ruthenium-containing layer containing ruthenium. First, the inventors considered adding nitrogen to ruthenium as a material of the ruthenium-containing layer in the phase shift film. By adding nitrogen to the ruthenium-containing layer, the crystallite size in the ruthenium-containing layer was reduced. However, by only adding nitrogen to the ruthenium-containing layer, a sidewall roughness when the ruthenium-containing layer was patterned was still large and did not meet the sidewall roughness required for the creation of fine patterns. Next, the inventors considered adding oxygen in addition to nitrogen in the ruthenium-containing layer. The inventors found that this can further reduce the crystallite size in the ruthenium-containing layer and reduce the sidewall roughness when the ruthenium-containing layer was patterned. However, nitrogen and oxygen are elements that increase the refractive index n and the extinction coefficient k in the ruthenium-containing layer. In particular, oxygen further increases the refractive index n and the extinction coefficient k compared to nitrogen. Therefore, depending on the content amount of oxygen and nitrogen in the ruthenium-containing layer, it may not be possible to satisfy the optical characteristics such as the refractive index n and the extinction coefficient k required for the ruthenium-containing layer.

The refractive index n and the extinction coefficient k in the ruthenium-containing layer are not determined only by the composition of the ruthenium-containing layer. Film density and crystal state of the phase shift film are also factors that affect the refractive index n and the extinction coefficient k. Therefore, simply specifying the composition of the ruthenium-containing layer may not be effective in reducing the crystallinity while satisfying the optical characteristics required for the ruthenium-containing layer.

The inventors further changed the idea and developed an X-ray diffraction profile obtained by an In-Plane measurement of an X-ray diffraction analysis (which may hereinafter be referred to simply as X-ray diffraction profile). In other words, the inventors analyzed by an In-Plane measurement of an X-ray diffraction analysis to obtain an X-ray diffraction profile, and focused on the relationship between the maximum value of diffraction intensity within a diffraction angle $2\theta$ ranging from 65 degrees to 75 degrees and the average value of the diffraction intensity within a diffraction angle $2\theta$ ranging from 55 degrees to 65 degrees, and found that when the relationship satisfies certain conditions, the crystallinity in the ruthenium-containing layer can further be reduced while satisfying the optical characteristics required for the ruthenium-containing layer.

In an X-ray diffraction profile of a ruthenium-containing film with Ru (110) plane orientation, the maximum value (peak) is detected in the diffraction intensity within a diffraction angle $2\theta$ ranging from 65 degrees to 75 degrees. The larger the maximum value of the diffraction intensity, the greater the orientation of the Ru (110) plane of the ruthenium-containing film tends to be. It can be regarded that the greater the orientation of the Ru (110) plane of the ruthenium-containing film, the higher the crystallinity of the ruthenium-containing film. On the other hand, the background of the diffraction intensity of an X-ray diffraction profile varies depending on the measurement conditions, etc. for ruthenium-containing layers formed of the same material. Therefore, it is difficult to use the maximum value of the diffraction intensity as it is as an index of crystallinity of a ruthenium-containing film. In the case of an X-ray diffraction profile of a ruthenium-containing film, the maximum value caused by crystallinity of ruthenium is hard to detect with a diffraction angle ranging from 55 degrees to 65 degrees. The inventors considered using the average value of each value of the diffraction intensity with the diffraction angle ranging from 55 degrees to 65 degrees to reduce the influence of the background of the measured X-ray diffraction profile. Specifically, the inventors realized that the value obtained by the maximum value of the diffraction intensity with the diffraction angle $2\theta$ ranging from 55 degrees to 65 degrees divided by an average of the diffraction intensity with the diffraction angle $2\theta$ ranging from 55 degrees to 65 degrees can be used as an index of crystallinity of ruthenium in the ruthenium-containing film.

As a result of the diligent study described above, to solve the aforementioned technical problem, the reflective mask blank of the present disclosure is a reflective mask blank having a multilayer reflective film and a thin film for pattern formation, in this order, on a main surface of a substrate, featured in that the thin film is a single layer structure consisting of a ruthenium-containing layer at least containing ruthenium, nitrogen, and oxygen or a multilayer structure including the ruthenium-containing layer, the ruthenium-containing layer is subjected to an analysis by an In-Plane measurement of an X-ray diffraction analysis to obtain an X-ray diffraction profile where, provided $I\_P1$ is the maximum value of a diffraction intensity within a diffraction angle $2\theta$ ranging from 65 degrees to 75 degrees and $I\_avg$ is the average value of a diffraction intensity within a diffraction angle $2\theta$ ranging from 55 degrees to 65 degrees, $I\_P1/I\_avg$ is greater than 1.0 and less than 3.0.

Next, the embodiment of the present disclosure is described concretely below together with the drawings. The embodiment given below is one of the embodiments upon embodying the present disclosure and is not intended to limit the present disclosure within such a scope. Same reference numerals are applied to identical or corresponding portions in the drawings of which descriptions may be simplified or omitted.

<Configuration of Reflective Mask Blank 100 and Method of Manufacturing the Same>

FIG. 1 is a schematic cross-sectional view of a principal portion for explaining the configuration of a reflective mask blank 100 according to this embodiment. As shown in FIG. 1, the reflective mask blank 100 includes a substrate 1, a multilayer reflective film 2, a protective film 3, and a phase shift film (thin film for pattern formation) 4, which are stacked in this order. The multilayer reflective film 2 is formed on a first main surface (front surface) side and reflects EUV light which is exposure light with a high reflectance. The protective film 3 is provided to protect the multilayer reflective film 2, and is made of a material having resistance to etchant and cleaning liquid used in patterning the phase shift film 4 to be mentioned below. The phase shift film 4 absorbs EUV light. A conductive film 5 for an electrostatic chuck is formed on a second main surface (back surface) side of the substrate 1.

FIG. 2 is a schematic cross-sectional view of a principal portion for explaining another configuration of a reflective mask blank 100 according to this embodiment. The reflective mask blank 100 shown in FIG. 2 includes a substrate 1, a multilayer reflective film 2, a protective film 3, a phase shift film 4, and a conductive film 5 similar as the case of FIG. 1, and further includes an etching mask film 6.

In this specification, the term "including a multilayer reflective film 2 on the main surface of the substrate 1" means that the multilayer reflective film 2 is disposed in contact with the surface of the substrate 1, and also includes the case where another film is provided between the substrate 1 and the multilayer reflective film 2. The same applies to other films. For example, "having a film B on a film A" means that the film A and the film B are disposed in direct contact with each other, and also includes the case of having another film provided between the film A and the film B. Further in this specification, for example, "the film A is disposed in contact with a surface of the film B" means that the film A and the film B are disposed in direct contact with each other without an interposing film between the film A and the film B.

The embodiment is explained below for each layer.

<<Substrate 1>>

The substrate 1 preferably has a low thermal expansion coefficient within the range of 0±5 ppb/° C. in order to prevent distortion of a phase shift pattern 4a (FIGS. 3A-3F) due to heat during exposure by EUV light. As a material having a low thermal expansion coefficient in this range, for example, $SiO_2$—$TiO_2$ based glass, multicomponent glass ceramics, etc. can be used.

The first main surface of the substrate 1 on the side where a transfer pattern (corresponding to phase shift pattern 4a described below) is formed thereon is surface-processed to have a high flatness at least from the viewpoint of obtaining pattern transfer precision and position precision. In the case of EUV exposure, in a region of 132 mm×132 mm on the main surface (first main surface) of the substrate 1 on the side where the transfer pattern is formed thereon, the flatness is preferably 0.1 μm or less, more preferably 0.05 μm or less, and particularly preferably 0.03 μm or less. On the second main surface of the opposite side where the transfer pattern is formed and which is subjected to an electrostatic chuck when set on an exposure apparatus, in a region of 132 mm×132 mm, the flatness is preferably 0.1 μm or less, more preferably 0.05 μm or less, and particularly preferably 0.03 μm or less. The flatness of the second main surface side of the reflective mask blank 100 in a region of 142 mm×142 mm is preferably 1 μm or less, more preferably 0.5 μm or less, and particularly preferably 0.3 μm or less.

A high surface smoothness of the substrate 1 is also a very important factor. The surface roughness of the first main surface of the substrate 1 on which a phase shift pattern 4a for transfer is formed is preferably a root mean square roughness (RMS) of 0.1 nm or less. The surface smoothness can be measured by an atomic force microscope.

Further, the substrate 1 preferably has high rigidity in order to restrain deformation of the film (such as multilayer reflective film 2) formed thereon due to film stress. In particular, the substrate 1 preferably has a high Young's modulus of 65 GPa or more.

<<Multilayer Reflective Film 2>>

The multilayer reflective film 2 provides a function of reflecting EUV light, and is a multilayer film in which layers respectively containing elements having different refractive indices as main components are stacked in cycles.

Generally, a multilayer film in which a thin film of a non-heavy element or a compound thereof as a high refractive index material (high refractive index layer) and a thin film of a heavy element or a compound thereof as a low refractive index material (low refractive index layer) are alternately stacked for about 40 to 60 cycles is used as the multilayer reflective film 2. The multilayer film can be formed by stacking a plurality of cycles, where one cycle consists of a stacked structure of high refractive index layer/low refractive index layer stacked in the order of the high refractive index layer and the low refractive index layer from the substrate 1 side. Further, the multilayer film can be formed by stacking a plurality of cycles, where one cycle consists of a stacked structure of low refractive index layer/high refractive index layer stacked in the order of the low refractive index layer and the high refractive index layer from the substrate 1 side. An uppermost layer of the multilayer reflective film 2, namely, the surface layer of the multilayer reflective film 2 on the side opposite to the substrate 1, is preferably the high refractive index layer. In the case of forming the aforementioned multilayer film by stacking a plurality of cycles, where one cycle consists of a stacked structure of high refractive index layer/low refractive index layer stacked in the order of the high refractive index layer and the low refractive index layer from the substrate 1, the uppermost layer is the low refractive index layer. In this case, the low refractive index layer configuring the uppermost surface of the multilayer reflective film 2 facilitates oxidization and causes reduction in reflectance of the reflective mask 200. Therefore, it is preferable to further form a high refractive index layer on the uppermost low refractive index layer to form the multilayer reflective film 2. On the other hand, in the case of forming the aforementioned multilayer film by stacking a plurality of cycles, where one cycle consists of a stacked structure of low refractive index layer/high refractive index layer stacked in the order of the low refractive index layer and the high refractive index layer from the substrate 1 side, the high refractive index layer is disposed as the uppermost layer and therefore may be left as it is.

In this embodiment, a layer containing silicon (Si) is employed as the high refractive index layer. The Si-containing material can contain Si alone, and can also be a Si compound containing Si and boron (B), carbon (C), nitrogen (N), and oxygen (O). By using a layer containing Si as the high refractive index layer, a reflective mask 200 for EUV lithography having an excellent reflectance to EUV light can be obtained. In this embodiment, a glass substrate is preferably used as the substrate 1. Si is also excellent in adhesion with a glass substrate. As the low refractive index layer, a single metal selected from molybdenum (Mo), ruthenium (Ru), rhodium (Rh), and platinum (Pt) or an alloy thereof is used. For example, as the multilayer reflective film 2 to EUV light having a wavelength of 13 nm to 14 nm, a Mo/Si cyclic stacked film in which Mo and Si films are alternately stacked for about 40 to 60 cycles is preferably used. The high refractive index layer, which is the uppermost layer of the multilayer reflective film 2, may be formed of silicon (Si).

A reflectance of the multilayer reflective film 2 alone is usually 65% or more, and the upper limit is usually 73%. The film thickness and cycle of each constituent layer of the multilayer reflective film 2 may be properly selected according to the exposure wavelength, and are selected to satisfy the Bragg's law of reflection. Although there are a plurality of high refractive index layers and a plurality of low refractive index layers in the multilayer reflective film 2, the film thicknesses of the high refractive index layers with one another and the low refractive index layers with one another may not be the same. The film thickness of the Si layer on the uppermost surface of the multilayer reflective film 2 can be adjusted so as not to reduce the reflectance. The film thickness of the Si layer of the uppermost surface (high refractive index layer) can be in the range from 3 nm to 10 nm.

A method of forming the multilayer reflective film 2 is known in this technical field. Each layer of the multilayer reflective film 2 can be formed by depositing the layers for example by ion beam sputtering method. In the case of the Mo/Si cyclic multilayer film described above, for example, a Si film having a thickness of about 4 nm is first formed on the substrate 1 by ion beam sputtering using a Si target. Thereafter, a Mo film having a thickness of about 3 nm is formed by using a Mo target. With this Si film/Mo film as one cycle, the cycles are stacked for 40 to 60 cycles to form the multilayer reflective film 2 (Si layer for the uppermost surface layer). When the multilayer reflective film 2 has for example sixty cycles, a reflectance to EUV light can be enhanced while the number of steps is increased compared to forty cycles. Upon formation of the multilayer reflective film 2, it is preferable that the multilayer reflective film 2 is formed by supplying krypton (Kr) ion particles from an ion source and performing ion beam sputtering.

<<Protective Film 3>>

The reflective mask blank 100 of this embodiment preferably has a protective film 3 between the multilayer reflective film 2 and the phase shift film 4.

The protective film 3 can be formed on the multilayer reflective film 2 or in contact with a surface of the multilayer reflective film 2 to protect the multilayer reflective film 2 from dry etching and cleaning in the manufacturing process of the reflective mask 200 to be described later. The protective film 3 also serves to protect the multilayer reflective film 2 upon black defect repair of a phase shift pattern 4a using an electron beam (EB). Although FIGS. 1 and 2 show the case where the protective film 3 has one layer, the protective film 3 can have a stacked structure of two or more layers. The protective film 3 is formed of a material having resistance to etchant and cleaning liquid used in patterning the phase shift film 4. By the protective film 3 being formed on the multilayer reflective film 2, it is possible to restrain damage on a surface of the multilayer reflective film 2 upon manufacturing a reflective mask 200 (EUV mask) using the substrate 1 having the multilayer reflective film 2 and the protective film 3. Therefore, an excellent reflectance property of the multilayer reflective film 2 to EUV light can be achieved.

Explanation is made below in the case where the protective film 3 has a single layer. When the protective film 3 includes multiple layers, the property of the material of the uppermost layer (layer in contact with the phase shift film 4) of the protective film 3 becomes important in relation to the phase shift film 4. Further, in this embodiment, since the phase shift film 4 includes multiple layers, the property of the material of the lowermost layer (layer in contact with the protective film 3, e.g., lower layer 41 when the phase shift film 4 consists of two layers) becomes important in relation to (the uppermost layer of) the protective film 3.

In the reflective mask blank 100 of this embodiment, a material having durability to etching gas used in dry etching for patterning the phase shift film 4 formed on the protective film 3 can be selected as the material of the protective film 3.

If the layer of the phase shift film 4 in contact with the surface of the protective film 3 is, for example, a thin film consisting of a material containing ruthenium (Ru) (Ru-based material) such as the lower layer 41 of this embodiment, the material of the protective film 3 can be selected from silicon-based materials such as silicon (Si), a material containing silicon (Si) and oxygen (O), a material containing silicon (Si) and nitrogen (N), and a material containing silicon (Si), oxygen (O), and nitrogen (N).

As described in this embodiment, when the lower layer 41 of the phase shift film 4 in contact with the surface of the protective film 3 is a thin film consisting of a material containing ruthenium (Ru) (Ru-based material), chlorine-based gas containing oxygen can be used as dry etching gas when patterning the phase shift film 4. In this case, it is preferable to select a silicon-based material for the material of the protective film 3, such as silicon (Si), a material containing silicon (Si) and oxygen (O), or a material containing silicon (Si) and nitrogen (N).

These silicon-based materials have durability to this dry etching gas, and the higher the oxygen content, the greater the durability. Therefore, the material of the protective film 3 is preferably silicon oxide ($SiO_x$, $1 \leq x \leq 2$), further preferably having greater x, and particularly preferably $SiO_2$. In the case where the phase shift film 4 includes a layer of thin film other than the predetermined Ru-based material, and the layer of the phase shift film 4 in contact with the surface of the protective film 3 is a thin film layer other than the Ru-based material, the material of the protective film 3 can be selected according to the etching characteristics of that material.

In EUV lithography, since there are not many materials that are transparent to exposure light, an EUV pellicle for preventing foreign substances from adhering to a mask pattern surface is not technically easy. Therefore, pellicleless operation without using a pellicle is the mainstream. In EUV lithography, exposure contamination occurs such as deposition of a carbon film or growth of an oxide film on a mask by EUV exposure light. Therefore, it is necessary to remove foreign substances and contamination on the mask by frequently cleaning the reflective mask 200 for EUV exposure at the stage when the reflective mask 200 for EUV exposure is used for manufacturing a semiconductor device. For this reason, the reflective mask 200 for EUV exposure is expected to have an extraordinary mask cleaning resistance than that of a transmissive mask for optical lithography. By the reflective mask 200 including the protective film 3, cleaning resistance to cleaning solutions can be enhanced.

The film thickness of the protective film 3 is not particularly limited as long as a function to protect the multilayer reflective film 2 can be exhibited. From the viewpoint of a reflectance of EUV light, the film thickness of the protective film 3 is preferably 1.0 nm or more and 8.0 nm or less, more preferably 1.5 nm or more and 6.0 nm or less.

As a method of forming the protective film 3, a method similar to known film forming methods can be employed without any particular limitation. Concrete examples include sputtering and ion beam sputtering.

<<Phase Shift Film (Thin Film 4)>>

In the reflective mask blank 100 of this embodiment, a phase shift film 4 for shifting the EUV light phase is formed on the multilayer reflective film 2 or on the protective film 3 formed on the multilayer reflective film 2. As shown in FIGS. 1 and 2, the phase shift film 4 of the reflective mask blank 100 of this embodiment includes a lower layer 41 and an uppermost layer 42.

In the reflective mask blank 100 of this embodiment, EUV light is absorbed and attenuated while a part of the light is reflected at a level that does not adversely affect pattern transfer in the area where the phase shift film 4 (phase shift pattern 4*a*) is provided. On the other hand, in an opening portion (area without the phase shift film 4), EUV light is reflected from the multilayer reflective film 2 (from the multilayer reflective film 2 through the protective film 3, if provided). The reflected light from the area where the phase shift film 4 is formed forms a desired phase difference with the reflected light from the opening portion. The phase shift film 4 is formed so that the phase difference between the reflected light from the phase shift film 4 and the reflected light from the multilayer reflective film 2 is from 130 degrees to 230 degrees. An image contrast of a projected optical image is improved by light with an inverted phase difference around 180 degrees or around 220 degrees interfering with each other at a pattern edge. This improvement of image contrast leads to an increase in resolution, and increases various tolerances related to exposure, such as exposure amount tolerance and focus tolerance.

Although it depends on the pattern and exposure conditions, to obtain the phase shift effect, a relative reflectance of the phase shift pattern 4*a* to EUV light is preferably 2% to 40%, more preferably 6 to 35%, further preferably 15% to 35%, and even more preferably 15% to 25%. A relative reflectance of the phase shift film 4 (phase shift pattern 4*a*) refers to a reflectance of EUV light reflected from the phase shift pattern 4*a* when EUV light reflected from the multilayer reflective film 2 (including multilayer reflective film 2 with protective film 3) in a portion without the phase shift pattern 4*a* has a reflectance of 100%. In this specification, the relative reflectance may be simply referred to as "reflectance".

Although it depends on the pattern and exposure conditions, to obtain the phase shift effect, an absolute reflectance of the phase shift film 4 (or phase shift pattern 4*a*) to EUV light is preferably 4% to 27%, and more preferably 10% to 17%.

The phase shift film 4 of the present embodiment includes a lower layer 41 and an uppermost layer 42. The uppermost layer 42 is the layer in the phase shift film 4 that is located on the topmost surface opposite to the multilayer reflective film 2. The lower layer 41 is the layer located in any position in the phase shift film 4 between the uppermost layer 42 and the multilayer reflective film 2. From the viewpoint of simplifying the film forming process, it is preferable that the phase shift film 4 consists of two layers, the lower layer 41 and the uppermost layer 42.

The phase shift film 4 of the reflective mask blank 100 of this embodiment includes a lower layer 41. The lower layer 41 is made of ruthenium (Ru) alone or a material containing ruthenium (Ru). The crystal structure of the lower layer 41 of the phase shift film 4 of the reflective mask blank 100 of this embodiment is preferably amorphous or microcrystalline. Concretely, it is preferable that when the lower layer 41 is subjected to an analysis by an In-Plane measurement of an X-ray diffraction method to obtain an X-ray diffraction profile where, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg is greater than 1.0 and less than 3.0.

I_P1/I_avg of 3.0 or more means that the maximum value I_P1 of diffraction intensity within a diffraction angle 2θ ranging from 65 degrees to 75 degrees is large. In this case, the lower layer 41 is highly crystalline and does not have a microcrystalline structure. In addition, I_P1/I_avg of 1.0 or less means that I_P1 is lower than the background level. In this case, there is a possibility of containing a significant amount of oxygen to amorphize the lower layer 41. In this case, it will be necessary to significantly increase the overall film thickness of the phase shift film 4, and is not preferable. From the viewpoint of making the lower layer 41 more amorphous or microcrystalline, I_P1/I_avg is more preferably 2.9 or less, and further preferably 2.8 or less.

Further, with the conditions of the diffraction intensity satisfied, in obtaining an X-ray diffraction profile of the lower layer 41, and provided I_P2 is the maximum value of diffraction intensity within a diffraction angle 2θ ranging from 35 degrees to 45 degrees and I_avg is the average value of diffraction intensity within a diffraction angle 2θ ranging from 55 degrees to 65 degrees, I_P2/I_avg is preferably 1.0 or more and 6.0 or less. I_P2/I_avg of greater than 6.0 means that the maximum value I_P2 of diffraction intensity within a diffraction angle 2θ ranging from 65 degrees to 75 degrees is large. In this case, the lower layer 41 is highly crystalline and does not have a microcrystalline structure. In addition, I_P2/I_avg of 1.0 or less means that I_P2 is lower than the background level. In this case, there is a possibility of containing a significant amount of oxygen to amorphize the lower layer 41. In this case, it will be necessary to significantly increase the overall film thickness of the phase shift film 4.

The lower layer 41 contains nitrogen and oxygen. If the lower layer 41 contains only nitrogen and free of oxygen, it is difficult to make the lower layer 41 amorphous or microcrystalline, and it is difficult to satisfy the above range of I_P1/I_avg. Further, if the lower layer 41 contains only oxygen and is free of nitrogen, it is possible to make the lower layer 41 amorphous or microcrystalline to satisfy the above range of I_P1/I_avg. In that case, however, it would be necessary to include a large amount of oxygen in the lower layer 41. In this case, it will be necessary to significantly increase the overall film thickness of the phase shift film 4.

On the other hand, the lower layer 41 is formed by sputtering method as described below. However, even if the formed thin films have the same composition, the crystallinity of the thin films may change depending on conditions such as the configuration of the sputtering apparatus used to form the thin film and the atmosphere in the sputtering chamber during film formation. Therefore, it is preferable to select the film forming conditions of the lower layer 41 by forming a thin film attempted to be applied to the lower layer 41 with a sputtering apparatus used in forming the lower layer 41, obtaining an X-ray diffraction profile of the thin film, and verifying whether I_P1/I_avg falls within the above range.

By making the lower layer 41 microcrystalline or amorphous, a line edge roughness of the sidewalls can be reduced when patterns were formed by dry etching. As the crystallinity of the lower layer 41 increases, the surface roughness of the lower layer 41 increases. Since the surface roughness of the lower layer 41 is reflected on the topmost surface layer, the larger the surface roughness of the lower layer 41, the larger the surface roughness of the phase shift film 4. The large surface roughness of the phase shift film 4 results in an increase of a so-called pseudo-defect, in which areas without defects are mistakenly detected as defects when defect inspection was performed using a defect inspection apparatus for mask blanks. By including nitrogen and oxygen in the lower layer 41 of the phase shift film 4, generation of these pseudo defects can be restrained.

By using a predetermined material as the lower layer 41 of the phase shift film 4 of the reflective mask blank 100 of this embodiment, a phase shift pattern 4a having a relative reflectance within a predetermined range can be obtained. By using a predetermined material as the lower layer 41 of the phase shift film 4 of the reflective mask blank 100 of this embodiment, an absolute reflectance of the phase shift film 4 to EUV light can be set within a predetermined range. Further, in the phase shift film 4 of the reflective mask blank 100 of this embodiment, the film thickness for obtaining a predetermined phase difference (phase difference between reflected light from the multilayer reflective film 2 (including multilayer reflective film 2 with protective film 3) in the opening portion and reflected light from the phase shift pattern 4a) can be reduced. Therefore, the shadowing effect caused by the phase shift pattern 4a can be further reduced in the reflective mask 200. In addition, by using the reflective mask 200 manufactured from the reflective mask blank 100 of this embodiment, the throughput in manufacturing semiconductor devices can be improved.

A ruthenium content of the lower layer 41 is preferably 30 atom % or more, more preferably 35 atom % or more, and even more preferably 40 atom % or more. Further, a ruthenium content of the lower layer 41 is preferably 95 atom % or less, more preferably 90 atom % or less, and even more preferably 80 atom % or less. The lower layer 41 can include metal elements other than ruthenium (Ru). These metal elements include chromium (Cr) and iridium (Ir), and chromium (Cr) is particularly preferable from the viewpoint of etching rate and crystallinity. When the lower layer 41 contains metal elements other than ruthenium (Ru), the content of the metal elements is preferably 5 atom % or more, and more preferably 10 atom % or more. Further, the content of metal elements in the lower layer 41 other than ruthenium (Ru) is preferably 40 atom % or less, and more preferably 30 atom % or less. By the content of the metal elements falling under the above composition range, the lower layer 41 of the phase shift film 4 having a predetermined reflectance and phase difference can be obtained. The metal element having the largest content in the lower layer 41 is preferably ruthenium.

The lower layer 41 preferably has more nitrogen content than the oxygen content. With the above condition satisfied, the oxygen content of the lower layer 41 is preferably 2 atom % or more, and more preferably 5 atom % or more. Further, the oxygen content of the lower layer 41 is preferably 30 atom % or less, and more preferably 20 atom % or less. Similarly, the nitrogen content of the lower layer 41 is preferably 5 atom % or more, and more preferably 10 atom % or more. Further, the nitrogen content of the lower layer 41 is preferably 50 atom % or less, and more preferably 40 atom % or less. Nitrogen and oxygen falling within the above composition range facilitates promotion of crystalline structure of the lower layer 41 to be amorphous or microcrystalline.

In this specification, the material of the lower layer 41 containing ruthenium (Ru), nitrogen (N), and oxygen (O) may be referred to as RuNO-based material. Further, the material of the lower layer 41 containing ruthenium (Ru), chromium (Cr), nitrogen (N), and oxygen (O) may be referred to as RuCrNO-based material. Since the material of the uppermost layer 42 described below also contains ruthenium (Ru), the materials of the lower layer 41 and the uppermost layer 42 in this embodiment may be collectively referred to as Ru-based materials.

In the phase shift film 4 of the reflective mask blank 100 of this embodiment, the element having the largest content in the lower layer 41 which is the ruthenium-containing layer is preferably ruthenium (Ru).

The refractive index n of Ru to EUV light is n=0.886 (extinction coefficient k=0.017), and is preferable as a material for the phase shift film 4 with high reflectance. Therefore, by including Ru as the element with the largest content in the lower layer 41 of the phase shift film 4, the phase shift film 4 with high reflectance to EUV light can be obtained.

A binary material with Cr added to Ru has superior processing characteristics compared to a conventional RuTa material. Ta is difficult to etch with chlorine-based gas and oxygen gas when oxidized.

The material of the lower layer 41 of the phase shift film 4 (predetermined RuNO-based material or RuCrNO-based material) can contain elements other than ruthenium (Ru), nitrogen (N), and oxygen (O) (and chromium (Cr)) within the range of not significantly affecting the refractive index and extinction coefficient. The material of the lower layer 41 can include elements such as carbon (C) or boron (B). Carbon (C), boron (B), etc. can be added to the material of the lower layer 41 within the range of not significantly affecting the refractive index n and extinction coefficient k in order to stabilize the lower layer 41, etc. If the material of the lower layer 41 of the phase shift film 4 contains Ru, N, and O (and Cr) and other elements, the content of such other elements is preferably 10 atom % or less, and more preferably 5 atom % or less.

The phase shift film 4 of the reflective mask blank 100 of this embodiment includes an uppermost layer 42. The uppermost layer 42 is preferably made of a material containing ruthenium (Ru). The same etching gas can be used in patterning the phase shift film 4 by dry etching. The uppermost layer 42 preferably contains oxygen. By including oxygen in a Ru-based compound, the crystalline structure can be more amorphous. The uppermost layer 42 can include metal elements other than ruthenium (Ru). These metal elements include chromium (Cr) and iridium (Ir), and chromium (Cr) is particularly preferable from the viewpoint of etching rate and crystallinity. Similarly, the crystal structure of the uppermost layer 42 is preferably amorphous or microcrystalline. When the uppermost layer 42 is formed of a material containing ruthenium (Ru), chromium (Cr), and oxygen (O), the total content of ruthenium (Ru), chromium (Cr), and oxygen (O) is preferably 70 atom % or more, more preferably 80 atom % or more, and even more preferably 90 atom % or more. The material of the uppermost layer 42 containing ruthenium (Ru), chromium (Cr), and oxygen (O) may be referred to as RuCrO-based material.

The material of the uppermost layer 42 of the phase shift film 4 of the reflective mask blank 100 of this embodiment is further explained.

In the phase shift film 4 of the reflective mask blank 100 of this embodiment, the element with the largest content in the uppermost layer 42 is preferably oxygen (O).

The uppermost layer 42 of the phase shift film 4 will contact the atmosphere, since the uppermost layer 42 is the topmost layer of the reflective mask 200. Containing oxygen (O) as the element with the largest content in the uppermost layer 42 of the phase shift film 4 of the reflective mask 200 restrains the change in optical characteristics due to oxidation of the topmost layer, so that chronological change in the phase difference and reflectance of the phase shift film 4 of the reflective mask 200 can be restrained.

The ruthenium (Ru) content of the uppermost layer 42 is preferably 2 atom % or more and 48 atom % or less, and more preferably 4 atom % or more and 46 atom % or less. Further, the chromium (Cr) content of the uppermost layer 42 is preferably 2 atom % or more and 48 atom % or less, and more preferably 4 atom % or more and 46 atom % or less. Further, the oxygen (O) content of the uppermost layer 42 is preferably 40 atom % or more and 75 atom % or less, and more preferably 45 atom % or more and 70 atom % or less. Applying the above composition range to Ru, Cr, and O can provide a function as an anti-reflective film against both EUV light (e.g., EUV light of 13.5 nm wavelength) and DUV light (e.g., DUV light of 193 nm wavelength).

Relatively high chromium (Cr) content (atom %) in the uppermost layer 42 compared to the lower layer 41 makes the crystallinity of the uppermost layer 42 more microcrystalline, and more durable to processes such as dry etching when removing the etching mask film 6.

In the reflective mask blank 100 of this embodiment, the refractive index n of the uppermost layer 42 to light of 13.5 nm wavelength is preferably greater than the refractive index n of the lower layer 41 to light of 13.5 nm wavelength.

In the reflective mask blank 100 of this embodiment, the refractive index n of the uppermost layer 42 to light of 13.5 nm wavelength of greater than the refractive index n of the lower layer 41 to light of 13.5 nm wavelength can provide the uppermost layer 42 with a function as an anti-reflective film against EUV light of 13.5 nm wavelength.

In the reflective mask blank 100 of this embodiment, the refractive index n of the uppermost layer 42 to light of 13.5 nm wavelength is preferably 0.94 or less.

In the reflective mask blank 100 of this embodiment, the refractive index n of the uppermost layer 42 to light of 13.5 nm wavelength of within a predetermined range can provide more proper function as an anti-reflective film to EUV light of 13.5 nm wavelength.

In the reflective mask blank 100 of this embodiment, the verticality of the pattern sidewall shape can be enhanced in patterning the phase shift film 4 by dry etching in manufacturing the reflective mask 200 as explained below.

As described in this embodiment, forming the uppermost layer 42 of the phase shift film 4 with a RuCrO-based material can reduce an etching rate of the uppermost layer 42 to dry etching using chlorine-based gas containing oxygen. Therefore, it is possible to suppress rounding of an edge of the uppermost layer 42 when a layer of the multilayer reflective film 2 side (e.g., lower layer 41) was over-etched than the uppermost layer 42 of the RuCrO-based material.

The phase difference and reflectance of the phase shift film 4 can be adjusted by changing the refractive index n, extinction coefficient k, and film thickness. Further, the film thickness of the phase shift film 4 is preferably 60 nm or less, more preferably 50 nm or less, and even more preferably 45 nm or less. The film thickness of the phase shift film 4 is preferably 25 nm or more. In the case of having the protective film 3, the phase difference and reflectance of the phase shift film 4 can be adjusted considering the refractive index n, extinction coefficient k, and film thickness of the protective film 3.

The thin film (e.g., lower layer 41 and uppermost layer 42) configuring the phase shift film 4 of the predetermined materials described above can be formed by known methods, such as sputtering methods including DC sputtering and RF sputtering, and reactive sputtering methods using oxygen gas or the like. An alloy target of Ru and Cr can be used as the target. The thin film forming the phase shift film 4 can be formed by co-sputtering using a Ru target and a Cr target.

The phase shift film 4 can be a multilayer film further including a layer or layers other than the lower layer 41 and the uppermost layer 42. For example, the phase shift film 4 can further include a layer between the lower layer 41 and the protective film 3 to enhance etching selectivity with the protective film 3. The phase shift film 4 can further include a layer between the uppermost layer 42 and the lower layer 41 to enhance the optical characteristics. From the viewpoint of productivity, it is preferable that there are not too many layers in the phase shift film 4. Therefore, it is preferable that the phase shift film 4 of this embodiment consists of two layers, the lower layer 41 and the uppermost layer 42. However, the phase shift film 4 of the present disclosure only needs to include at least the lower layer 41, and may be configured as a single layer structure using the material that constitutes the lower layer 41 described above.

Even if the film thickness of the phase shift film 4 varied slightly from the designed value (e.g., within ±0.5% of the designed film thickness), it is preferable that the phase difference has a variation between planes in the range of predetermined phase difference±2 degrees (e.g., within 180 degrees±2 degrees for the phase difference of 180 degrees), and the reflectance has a variation between planes in the range of predetermined reflectance±0.2% (e.g., within 6%±0.2% for the relative reflectance of 6%). When the phase shift film 4 is formed as a multilayer film, it is easier to control the phase difference variation and reflectance variation between planes to be within the predetermined range. Thus, by forming the phase shift film 4 into a multilayer film, it is possible to add various functions to each layer.

<<Etching Mask Film 6>>

An etching mask film 6 can be formed on the phase shift film 4 or in contact with a surface of the phase shift film 4. As a material of the etching mask film 6, a material having high etching selectivity ratio of the phase shift film 4 to the etching mask film 6 is used. "Etching selectivity ratio of B to A" herein refers to the ratio of etching rate between A, a layer that does not need to be etched (mask layer), and B, a layer that needs to be etched. Specifically, the ratio is defined by the formula "etching selectivity ratio of B to A=etching rate of B/etching rate of A". Further, "high selectivity ratio" means that the value of the above-defined selectivity ratio is greater than the target to be compared. An etching selectivity ratio of the phase shift film 4 to the etching mask film 6 is preferably 1.5 or more and further preferably 3 or more.

The phase shift film 4 formed of a Ru-based material of this embodiment can be etched by dry etching using chlorine-based gas containing oxygen, or oxygen gas. As a material with high etching selectivity ratio of the phase shift film 4 of a Ru-based material to the etching mask film 6, a material of silicon (Si) or a silicon compound can be used.

Examples of silicon compounds that can be used in the etching mask film 6 include materials containing silicon (Si) and at least one element selected from nitrogen (N), oxygen (O), carbon (C), and hydrogen (H), and materials such as metal silicon (metal silicide) or metal silicon compound (metal silicide compound) containing metal in silicon or silicon compound. A metal silicon compound can include a material containing a metal and Si, and at least one element selected from N, O, C, and H.

A film thickness of the etching mask film 6 is preferably 2 nm or more from the viewpoint of obtaining a function as an etching mask for precisely forming a transfer pattern in the phase shift film 4. The film thickness of the etching mask film 6 is preferably 15 nm or less from the viewpoint of reducing the film thickness of a resist film 8.

<<Conductive Film 5>>

A conductive film 5 for an electrostatic chuck is generally formed on the second main surface (back surface) side of the substrate 1 (opposite to the surface on which the multilayer reflective film 2 is formed). Electrical characteristic (sheet resistance) required for the conductive film 5 for an electrostatic chuck is usually 100Ω/□ (Ω/Square) or less. The conductive film 5 can be formed by, for example, magnetron sputtering or ion beam sputtering, using a metal and alloy target of chromium (Cr), tantalum (Ta), etc.

The material containing chromium (Cr) of the conductive film 5 is preferably a Cr compound containing Cr and further containing at least one element selected from boron (B), nitrogen (N), oxygen (O), and carbon (C).

As the material containing tantalum (Ta) of the conductive film 5, it is preferable to use Ta (tantalum), an alloy containing Ta, or a Ta compound containing any of the above and at least one of boron, nitrogen, oxygen, and carbon.

The thickness of the conductive film 5 is not particularly limited as long as the function as an electrostatic chuck is satisfied. The thickness of the conductive film 5 is generally from 10 nm to 200 nm. The conductive film 5 also has a function to adjust the stress on the second main surface side of the mask blank 100. Therefore, the conductive film 5 is adjusted so as to obtain a flat reflective mask blank 100 in balance with stresses from various films formed on the first main surface side.

<Reflective Mask 200 and its Manufacturing Method>

This embodiment is a reflective mask 200 including a multilayer reflective film 2 and a phase shift film 4 with a transfer pattern in this order on a main surface of a substrate 1. The phase shift film 4 with a transfer pattern (phase shift pattern 4a) is a phase shift film 4 that is the same as the phase shift film 4 of the reflective mask blank 100 of the embodiment described above. By patterning the phase shift film 4 of the reflective mask blank 100 of this embodiment, a phase shift pattern 4a (transfer pattern) can be formed. The patterning of the phase shift film 4 can be done by predetermined dry etching gas. The phase shift pattern 4a of the reflective mask 200 absorbs EUV light, and some EUV light can be reflected with a predetermined phase difference with respect to an opening portion (portion without phase shift pattern 4a). The predetermined dry etching gas can be mixture gas of chlorine-based gas and oxygen gas, and oxygen gas, etc. To pattern the phase shift film 4, an etching mask film 6 can be provided on the phase shift film 4 if necessary. In such a case, an etching mask pattern 6a can be used as a mask to dry-etch the phase shift film 4 to form the phase shift pattern 4a.

Explanation is made on a method of manufacturing a reflective mask 200 using the reflective mask blank 100 of this embodiment. Only an outline is explained herein, and a detailed description is made later in the examples, referring to the drawings. Further, an explanation is made on an example using a reflective mask blank 100 having an etching mask film 6 as shown in FIG. 2.

A reflective mask blank 100 is prepared, and a resist film 8 is formed on an etching mask film 6 of a first main surface (not necessary if resist film 8 is provided as reflective mask blank 100). A desired pattern is written (exposed) in the resist film 8, and further developed and rinsed to form a predetermined resist pattern 8a.

Next, the etching mask film 6 is etched with the resist pattern 8a as a mask to form an etching mask pattern 6a. Thereafter, the resist pattern 8a is removed by ashing or by resist peeling liquid. With the etching mask pattern 6a as a mask, the phase shift film 4 is etched to form a phase shift pattern 4a. Next, by removing the etching mask pattern 6a, the phase shift pattern 4a is formed. Finally, wet cleaning using an acidic or alkaline aqueous solution is performed.

Since the material of the phase shift film 4 is a Ru-based material, chlorine-based gas containing oxygen or oxygen gas is used as the etching gas for the phase shift film 4. In using this etching gas, the protective film 3 being formed of silicon (Si) or a material containing silicon (Si) and oxygen (O) can prevent the occurrence of roughness on the surface of the protective film 3 during etching of the phase shift film 4.

By the above process, the reflective mask 200 with a highly precise, fine phase shift pattern 4a with less shadowing effect and less sidewall roughness can be obtained.

<Method of Manufacturing Semiconductor Device>

This embodiment is a method of manufacturing a semiconductor device including the use of the aforementioned reflective mask 200. The semiconductor device can be manufactured by setting the reflective mask 200 of this embodiment on an exposure apparatus having an exposure light source of EUV light, and transferring a transfer pattern onto a resist film formed on a substrate to be transferred.

Concretely, by performing an EUV exposure using the reflective mask 200 of this embodiment, a desired transfer pattern based on the phase shift pattern 4a can be formed on the semiconductor substrate. Even if the film thickness of the phase shift film of the reflective mask 200 has changed, since the phase shift film of the reflective mask 200 has a small variation in the phase difference and/or reflectance of the phase shift film, a desired pattern can be formed on the semiconductor substrate in high dimensional precision. Further, since the phase shift pattern 4a is a fine, highly precise pattern with little sidewall roughness, it is advantageous to form a desired pattern on the semiconductor substrate with high dimensional precision. In addition to the lithography step, a semiconductor device having a desired electronic circuit formed thereon can be manufactured by performing various steps such as etching of a film to be processed, formation of an insulating film and a conductive film, introduction of a dopant, and annealing.

The reflective mask blank 100 of this embodiment is featured in having a phase shift film 4 with a lower layer 41 consisting of a ruthenium-containing layer at least containing ruthenium, nitrogen, and oxygen in which, when the lower layer 41 is subjected to an analysis by an In-Plane measurement of an X-ray diffraction method to obtain an X-ray diffraction profile where, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg is greater than 1.0 and less than 3.0. Accordingly, a reflective mask blank 100 can be provided which has a phase shift film 4 which can further reduce crystallinity (further enhance microcrystalline or amorphous characteristics) of the lower layer 41 of the phase shift film 4 while satisfying optical characteristics of the lower layer 41. As a result, the reflective mask 200 of this embodiment has less sidewall roughness of the lower layer pattern 41a in the phase shift pattern 4a, and has a stable cross-sectional shape. Therefore, by using the reflective mask blank 100 of this embodiment, a semiconductor device having a fine, highly precise transfer pattern can be manufactured.

EXAMPLES

The examples are described below together with the drawings. This embodiment is not limited to these examples. In the examples, an identical reference numeral is applied to similar components and explanation thereof is omitted or simplified.

Example 1

As Example 1, a reflective mask blank 100 having the structure shown in FIG. 2 was manufactured. The reflective mask blank 100 includes a conductive film 5, a substrate 1, a multilayer reflective film 2, a protective film 3, a phase shift film 4, and an etching mask film 6. The phase shift film 4 of Example 1 has an uppermost layer 42 and a lower layer 41. First, explanation is made below on the method of manufacturing the reflective mask blank 100 of Example 1.

A $SiO_2$—$TiO_2$-based glass substrate which is a low thermal expansion glass substrate of 6025 size (about 152 mm×152 mm×6.35 mm) having both of a first main surface and a second main surface polished was prepared as the substrate 1. To obtain flat, smooth main surfaces, polishing steps including a rough polishing process, a precision polishing process, a local process, and a touch polishing process were performed.

Next, a conductive film 5 consisting of a CrN film was formed on the second main surface (back surface) of the $SiO_2$—$TiO_2$-based glass substrate 1 by magnetron sputtering (reactive sputtering) under the following conditions. The conductive film 5 was formed with the film thickness of 20 nm using a Cr target under a mixed gas atmosphere of argon (Ar) gas and nitrogen ($N_2$) gas.

Next, the multilayer reflective film 2 was formed on the main surface (first main surface) on the substrate 1 that is opposite to the side on which the conductive film 5 was formed. The multilayer reflective film 2 formed on the substrate 1 was formed as a cyclic multilayer reflective film consisting of molybdenum (Mo) and silicon (Si) so that the multilayer reflective film 2 is suitable for EUV light of 13.5 nm wavelength. The multilayer reflective film 2 was formed by alternately stacking a Mo layer and a Si layer on the substrate 1 using a Mo target and a Si target and by ion beam sputtering in krypton (Kr) gas atmosphere. First, a Si film was formed with the film thickness of 4.2 nm and a Mo film with the film thickness of 2.8 nm. With the above as one cycle, forty cycles were stacked similarly, and finally a Si film was formed with the film thickness of 4.0 nm and the multilayer reflective film 2 was formed.

Next, the protective film 3 consisting of a $SiO_2$ film was formed with the thickness of 2.6 nm on a surface of the multilayer reflective film 2 in an Ar gas atmosphere using a $SiO_2$ target by RF sputtering.

Next, a thin film consisting of ruthenium (Ru), chromium (Cr), nitrogen (N), and oxygen (O) (RuCrNO film) was formed as the lower layer 41 of the phase shift film 4 of Example 1 by DC magnetron sputtering. The lower layer 41 was formed with the film thickness of 33.5 nm using a Ru target and a Cr target, under a mixed gas atmosphere of krypton (Kr) gas, nitrogen ($N_2$) gas, and oxygen ($O_2$) gas. The gas flow ratio during film formation was Kr:$N_2$:$O_2$=12:8:1. The film was formed by applying 1500 W power supply to the Ru target and 500 W power supply to the Cr target, respectively.

An RuCrNO film formed by the same procedure on another substrate was subjected to an In-Plane measurement of an X-ray diffraction analysis using an X-ray diffraction apparatus (XRD) to analyze the crystalline structure of the film, and an X-ray diffraction profile was obtained. FIG. 4 shows the relationship between the diffraction angle and the diffraction intensity when the phase shift film using the material corresponding to the lower layer of Example 1 was measured by an In-Plane measurement method of an X-ray diffraction analysis. Based on the result of the measurement, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg was 2.554, satisfying the condition of greater than 1.0 and less than 3.0.

Further, based on the result of the measurement, provided I_P2 is the maximum value of diffraction intensity within a diffraction angle 2θ ranging from 35 degrees to 45 degrees and I_avg is the average value of diffraction intensity within a diffraction angle 2θ ranging from 55 degrees to 65 degrees, I_P2/I_avg was 4.180, satisfying the condition of 1.0 or more and 6.0 or less.

Further, a cross-sectional TEM (Transmission Electron Microscope) image of the RuCrNO film formed on another substrate by the same procedure as the lower layer of Example 1 was taken, and a columnar structure was not found in the crystal condition of the RuCrNO film, and was confirmed as a microcrystalline or amorphous structure.

The refractive index n and extinction coefficient (imaginary part of refractive index) k of the lower layer 41 of Example 1 thus formed (RuCrNO film) in 13.5 nm wavelength were as shown below, respectively.

RuCrNO film: n=0.894, k=0.019

Next, a thin film consisting of ruthenium (Ru), chromium (Cr), and oxygen (O) (RuCrO film) was formed as the uppermost layer 42 of the phase shift film 4 by DC magnetron sputtering (reactive sputtering). The uppermost layer 42 was formed with the film thickness of 8.5 nm using a Ru target and a Cr target under a mixed gas atmosphere of krypton (Kr) gas and oxygen ($O_2$) gas by reactive sputtering. A RuCrO film formed on another substrate by the same procedure was analyzed by an X-ray photoelectron spectroscopy, and the composition of the RuCrO film (atomic ratio) was Ru:Cr:O=18.1:29.5:52.4.

Only a RuCrO film was formed on another substrate by the same procedure as the uppermost layer 42. The RuCrO film was subjected to an In-Plane measurement of an X-ray diffraction analysis by an X-ray diffraction apparatus (XRD), and the RuCrO film was found to have an amorphous structure.

The refractive index n and extinction coefficient (imaginary part of refractive index) k of the uppermost layer 42 of Example 1 thus formed (RuCrO film) in 13.5 nm wavelength were as shown below, respectively.

RuCrO film: n=0.931, k=0.027

Next, an etching mask film 6 consisting of a $Si_3N_4$ film was formed on the phase shift film 4. The $Si_3N_4$ film was formed with the film thickness of 20 nm using a Si target in a nitrogen gas atmosphere by reactive sputtering. By the above procedure, the reflective mask blank 100 of Example 1 was manufactured.

Next, a reflective mask 200 of Example 1 was manufactured using the reflective mask blank 100.

FIGS. 3A-3F are schematic cross-sectional views of a principal portion showing the steps of manufacturing a reflective mask 200 from the reflective mask blank 100. First, the reflective mask blank 100 of Example 1 was prepared (FIG. 3A).

A resist film 8 was formed with the thickness of 100 nm on the etching mask film 6 of the reflective mask blank 100 (FIG. 3B). A desired pattern was written (exposed) on the resist film 8, and further developed and rinsed to form a predetermined resist pattern 8a (FIG. 3C). Next, with the resist pattern 8a as a mask, the etching mask film 6 ($Si_3N_4$ film) was subjected to dry etching using $CF_4$ gas and an etching mask pattern 6a was formed (FIG. 3D). Thereafter, the resist pattern 8a was peeled by oxygen ashing. Next, with the etching mask pattern 6a as a mask, the RuCrO film (uppermost layer 42) and the RuCrNO film (lower layer 41) of the phase shift film 4 were subjected to dry etching using mixed gas of $Cl_2$ gas and $O_2$ gas, and a phase shift pattern 4a including a lower layer pattern 41a and an uppermost layer pattern 42a was formed (FIG. 3E).

Thereafter, the etching mask pattern 6a was removed. Finally, wet cleaning using pure water (DIW) was performed and the reflective mask 200 of Example 1 was manufactured (FIG. 3F). A mask defect inspection can be made after the wet cleaning if necessary, and a mask defect repair can be performed properly.

The phase shift film 4 (phase shift pattern 4a) of Example 1 having the uppermost layer 42 and the lower layer 41 had a relative reflectance of 14.3% in 13.5 nm wavelength. Further, the film thickness of the phase shift film 4 is 43.0 nm. This film thickness corresponds to when the phase difference when the phase shift film 4 was patterned is about 220 degrees.

In the reflective mask blank 100 used in manufacturing the reflective mask 200 of Example 1, the lower layer 41 of the phase shift film 4 satisfied the condition of I_P1/I_avg of greater than 1.0 and less than 3.0. Therefore, there was less sidewall roughness of the lower layer pattern 41a in the phase shift pattern 4a, and had a stable cross-sectional shape. Therefore, the resist pattern 8a transferred using the reflective mask 200 having this phase shift pattern 4a had high transfer precision with less in-plane variation of LER and dimension. In addition, since the relative reflectance of the phase shift film (reflectance relative to reflectance of surface of multilayer reflective film 2 with protective film 3) is within a predetermined range, a sufficient phase shifting effect can be obtained, and an EUV exposure with high exposure tolerance and focus tolerance could be performed.

The reflective mask 200 manufactured in Example 1 was set on an EUV scanner, and an EUV exposure was made on a wafer having a film to be processed and a resist film formed on a semiconductor substrate. By developing the exposed resist film, a resist pattern was formed on the semiconductor substrate having a film to be processed. A semiconductor device having desired characteristics was manufactured by transferring the resist pattern on the film to be processed by etching, and through various steps such as formation of an insulating film and a conductive film, introduction of a dopant, and annealing.

Example 2

In Example 2, a reflective mask blank 100 and a reflective mask 200 were manufactured by the structure and method similar to Example 1 except for the lower layer 41 of the phase shift film 4, and a semiconductor device was manufactured by the method similar to Example 1.

A thin film consisting of ruthenium (Ru), chromium (Cr), nitrogen (N), and oxygen (O) (RuCrNO film) was formed as a lower layer 41 of a phase shift film 4 of Example 2 by DC magnetron sputtering. The lower layer 41 was formed with the film thickness of 33.5 nm using a Ru target and a Cr target, under a mixed gas atmosphere of krypton (Kr) gas, nitrogen ($N_2$) gas, and oxygen ($O_2$) gas. The gas flow ratio during film formation was $Kr:N_2:O_2$=6:4:1. The film was formed by applying 1500 W power supply to the Ru target and 500 W power supply to the Cr target, respectively.

A RuCrNO film formed by the same procedure on another substrate was subjected to an In-Plane measurement of an X-ray diffraction analysis using an X-ray diffraction apparatus (XRD) to analyze the crystalline structure of the film, and an X-ray diffraction profile was obtained. FIG. 5 shows the relationship between the diffraction angle and the diffraction intensity when the phase shift film using the material corresponding to the lower layer of Example 2 was measured by an In-Plane measurement method of an X-ray diffraction analysis. Based on the result of the measurement, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg was 1.712, satisfying the condition of greater than 1.0 and less than 3.0.

Further, based on the result of the measurement, provided I_P2 is the maximum value of diffraction intensity within a diffraction angle 2θ ranging from 35 degrees to 45 degrees and I_avg is the average value of diffraction intensity within a diffraction angle 2θ ranging from 55 degrees to 65 degrees, I_P2/I_avg was 4.422, satisfying the condition of 1.0 or more and 6.0 or less.

Further, a cross-sectional TEM image of the RuCrNO film formed on another substrate by the same procedure as the lower layer of Example 2 was taken, and a columnar structure was not found in the crystal condition of the RuCrNO film, and was confirmed as a microcrystalline or amorphous structure.

The refractive index n and extinction coefficient (imaginary part of refractive index) k of the lower layer 41 of Example 2 thus formed (RuCrNO film) in 13.5 nm wavelength were as shown below, respectively.

RuCrNO film: n=0.899, k=0.019

The phase shift film 4 (phase shift pattern 4a) of Example 2 having the uppermost layer 42 and the lower layer 41 had a relative reflectance of 14.1% in 13.5 nm wavelength. Further, the film thickness of the phase shift film 4 is 43.0 nm. This film thickness corresponds to when the phase difference when the phase shift film 4 was patterned is about 220 degrees.

In the reflective mask blank 100 used in manufacturing the reflective mask 200 of Example 2, the lower layer 41 of the phase shift film 4 satisfied the condition of I_P1/I_avg of greater than 1.0 and less than 3.0. Therefore, there was less sidewall roughness of the lower layer pattern 41a in the phase shift pattern 4a, and had a stable cross-sectional shape. Therefore, the resist pattern 8a transferred using the reflective mask 200 having this phase shift pattern 4a had high transfer precision with less in-plane variation of LER and dimension. In addition, since the relative reflectance of the phase shift film (reflectance relative to reflectance of surface of multilayer reflective film 2 with protective film 3) is within a predetermined range, a sufficient phase shifting effect can be obtained, and an EUV exposure with high exposure tolerance and focus tolerance could be performed.

The reflective mask 200 manufactured in Example 2 was set on an exposure apparatus, and a wafer having a film to be processed and a resist film formed on a semiconductor substrate was subjected to an EUV exposure. By developing the exposed resist film, a resist pattern was formed on the semiconductor substrate having a film to be processed. A semiconductor device having desired characteristics was manufactured by transferring the resist pattern on the film to be processed by etching, and through various steps such as formation of an insulating film and a conductive film, introduction of a dopant, and annealing.

Example 3

In Example 3, a reflective mask blank 100 and a reflective mask 200 were manufactured by the structure and method similar to Example 1 except for the lower layer 41 of the phase shift film 4, and a semiconductor device was manufactured by the method similar to Example 1.

A thin film consisting of ruthenium (Ru), nitrogen (N), and oxygen (O) (RuNO film) was formed as a lower layer 41 of a phase shift film 4 of Example 3 by DC magnetron sputtering. The lower layer 41 was formed with the film thickness of 29.5 nm using a Ru target with a mixed gas atmosphere of xenon (Xe) gas and nitrogen ($N_2$) gas. The gas flow ratio during film formation was Xe:$N_2$:$O_2$=6:3:1. The film was formed by applying 1500 W power supply to the Ru target.

A RuNO film formed by the same procedure on another substrate was subjected to an In-Plane measurement of an X-ray diffraction analysis using an X-ray diffraction apparatus (XRD) to analyze the crystalline structure of the film, and an X-ray diffraction profile was obtained. FIG. 6 shows the relationship between the diffraction angle and the diffraction intensity when the phase shift film using the material corresponding to the lower layer of Example 3 was measured by an In-Plane measurement method of an X-ray diffraction analysis. Based on the result of the measurement, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg was 1.749, satisfying the condition of greater than 1.0 and less than 3.0.

Further, based on the result of the measurement, provided I_P2 is the maximum value of diffraction intensity within a diffraction angle 2θ ranging from 35 degrees to 45 degrees and I_avg is the average value of diffraction intensity within a diffraction angle 2θ ranging from 55 degrees to 65 degrees, I_P2/I_avg was 5.888, satisfying the condition of 1.0 or more and 6.0 or less.

Further, a cross-sectional TEM image of the RuNO film formed on another substrate by the same procedure as Example 3 was taken, and a columnar structure was not found in the crystal condition of the RuNO film, and was confirmed as a microcrystalline structure or an amorphous.

The refractive index n and extinction coefficient (imaginary part of refractive index) k of the lower layer 41 of Example 3 thus formed (RuNO film) in 13.5 nm wavelength were as shown below, respectively.

RuNO film: n=0.896, k=0.015

The phase shift film 4 (phase shift pattern 4a) of Example 3 having the uppermost layer 42 and the lower layer 41 had a relative reflectance of 17.0% in 13.5 nm wavelength. Further, the film thickness of the phase shift film 4 is 38 nm. This film thickness corresponds to when the phase difference when the phase shift film 4 was patterned is about 220 degrees.

In the reflective mask blank 100 used in manufacturing the reflective mask 200 of Example 3, the lower layer 41 of the phase shift film 4 satisfied the condition of I_P1/I_avg of greater than 1.0 and less than 3.0. Therefore, there was less sidewall roughness of the lower layer pattern 41a in the phase shift pattern 4a, and had a stable cross-sectional shape. Therefore, the resist pattern 8a transferred using the reflective mask 200 having this phase shift pattern 4a had high transfer precision with less in-plane variation of LER and dimension. In addition, since the relative reflectance of the phase shift film (reflectance relative to reflectance of surface of multilayer reflective film 2 with protective film 3) is within a predetermined range, a sufficient phase shifting effect can be obtained, and an EUV exposure with high exposure tolerance and focus tolerance could be performed.

The reflective mask 200 of Example 3 was set on an EUV scanner, and an EUV exposure was made on a wafer having a film to be processed and a resist film formed on a semiconductor substrate. By developing the exposed resist film, a resist pattern was formed on the semiconductor substrate having a film to be processed. A semiconductor device having desired characteristics was manufactured by transferring the resist pattern on the film to be processed by etching, and through various steps such as formation of an insulating film and a conductive film, introduction of a dopant, and annealing.

Comparative Example 1

In Comparative Example 1, a reflective mask blank 100 and a reflective mask 200 were manufactured by the structure and method similar to Example 1 except for the lower layer 41 of the phase shift film 4, and a semiconductor device was manufactured by the method similar to Example 1.

A thin film consisting of ruthenium (Ru), chromium (Cr), and nitrogen (N) (RuCrN film) was formed as a lower layer 41 of a phase shift film 4 of Comparative Example 1 by DC magnetron sputtering. The lower layer 41 was formed with the film thickness of 33.5 nm using a Ru target and a Cr target under a mixed gas atmosphere of krypton (Kr) gas and nitrogen ($N_2$) gas. The gas flow ratio during film formation was Kr:$N_2$=4:3. The film was formed by applying 1500 W power supply to the Ru target and 500 W power supply to the Cr target, respectively.

A RuCrN film formed by the same procedure on another substrate was subjected to an In-Plane measurement of an X-ray diffraction analysis using an X-ray diffraction apparatus (XRD) to analyze the crystalline structure of the film, and an X-ray diffraction profile was obtained. FIG. 7 shows the relationship between the diffraction angle and the diffraction intensity when the phase shift film using the material corresponding to the lower layer of Comparative Example 1 was measured by an In-Plane measurement method of an X-ray diffraction analysis. Based on the result of the measurement, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg was 3.046 and did not satisfy the condition of greater than 1.0 and less than 3.0.

Further, based on the result of the measurement, provided I_P2 is the maximum value of diffraction intensity within a diffraction angle 2θ ranging from 35 to 45 degrees and I_avg is the average value of diffraction intensity within a diffraction angle 2θ ranging from 55 degrees to 65 degrees, I_P2/I_avg was 6.167 and did not satisfy the condition of 1.0 or more and 6.0 or less.

Further, a cross-sectional TEM image of the RuCrN film formed on another substrate by the same procedure as Comparative Example 1 was taken, and a columnar structure was found in the crystal condition of the thin film, and was confirmed as a crystalline structure.

The refractive index n and extinction coefficient (imaginary part of refractive index) k of the lower layer 41 of Comparative Example 1 thus formed (RuCrN film) in 13.5 nm wavelength were as shown below, respectively.

RuCrN film: n=0.896, k=0.020

The phase shift film 4 (phase shift pattern 4a) of Comparative Example 1 having the uppermost layer 42 and the lower layer 41 had a relative reflectance of 14.4% in 13.5 nm wavelength. Further, the film thickness of the phase shift film is 43 nm. This film thickness corresponds to when the phase difference when the phase shift film 4 was patterned is about 220 degrees.

In the reflective mask blank 100 used in manufacturing the reflective mask 200 of Comparative Example 1, the lower layer 41 of the phase shift film 4 did not satisfy the condition of I_P1/I_avg of greater than 1.0 and less than 3.0.

Therefore, in Comparative Example 1 compared to Example 1, a step difference was generated in a sidewall of the lower layer pattern 41a of the phase shift pattern 4a of the reflective mask 200 that was manufactured and obtained. Therefore, the resist pattern 8a transferred using the reflective mask 200 having this phase shift pattern 4a had significant in-plane variation of LER and dimension, and transfer precision was not so high.

Unlike Example 1, in the case where the reflective mask 200 of Comparative Example 1 was used, a semiconductor device having desired characteristics could not be manufactured.

Comparative Example 2

In Comparative Example 2, a reflective mask blank 100 and a reflective mask 200 were manufactured by the structure and method similar to Example 1 except for the lower layer 41 of the phase shift film 4, and a semiconductor device was manufactured by the method similar to Example 1.

A thin film consisting of ruthenium (Ru) and nitrogen (N) (RuN film) was formed as a lower layer 41 of a phase shift film 4 of Comparative Example 2 by DC magnetron sputtering. The lower layer 41 was formed with the film thickness of 29.5 nm using a Ru target under a mixed gas atmosphere of xenon (Xe) gas and nitrogen ($N_2$) gas. The gas flow ratio during film formation was $Kr:N_2=2:1$. The film was formed by applying 1500 W power supply to the Ru target.

A RuN film formed by the same procedure on another substrate was subjected to an In-Plane measurement of an X-ray diffraction analysis using an X-ray diffraction apparatus (XRD) to analyze the crystalline structure of the film, and an X-ray diffraction profile was obtained. FIG. 8 shows the relationship between the diffraction angle and the diffraction intensity when the phase shift film using the material corresponding to the lower layer of Comparative Example 2 was measured by an In-Plane measurement method of an X-ray diffraction analysis. Based on the result of the measurement, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg was 5.361 and did not satisfy the condition of greater than 1.0 and less than 3.0.

Further, based on the result of the measurement, provided I_P2 is the maximum value of diffraction intensity within a diffraction angle 2θ ranging from 35 degrees to 45 degrees and I_avg is the average value of diffraction intensity within a diffraction angle 2θ ranging from 55 degrees to 65 degrees, I_P2/I_avg was 14.658 and did not satisfy the condition of 1.0 or more and 6.0 or less.

Further, a cross-sectional TEM image of the RuN film formed on another substrate by the same procedure as Comparative Example 2 was taken, and a columnar structure was found in the crystal condition of the thin film, and was confirmed as a crystalline structure.

The refractive index n and extinction coefficient (imaginary part of refractive index) k of the lower layer 41 of Comparative Example 2 thus formed (RuN film) in 13.5 nm wavelength were as shown below, respectively.

RuN film: n=0.888, k=0.017

The phase shift film 4 (phase shift pattern 4a) of Comparative Example 2 having the uppermost layer 42 and the lower layer 41 had a relative reflectance of 17.4% in 13.5 nm wavelength. Further, the film thickness of the phase shift film is 38 nm. This film thickness corresponds to when the phase difference when the phase shift film 4 was patterned is about 220 degrees.

In the reflective mask blank 100 used in manufacturing the reflective mask 200 of Comparative Example 2, the lower layer 41 of the phase shift film 4 did not satisfy the condition of I_P1/I_avg of greater than 1.0 and less than 3.0.

Therefore, in Comparative Example 2 compared to Example 1, a step difference was generated in a sidewall of the lower layer pattern 41a of the phase shift pattern 4a of the reflective mask 200 that was manufactured and obtained. Therefore, the resist pattern 8a transferred using the reflective mask 200 having this phase shift pattern 4a had significant in-plane variation of LER and dimension, and transfer precision was not so high.

Unlike Example 1, in the case where the reflective mask 200 of Comparative Example 2 was used, a semiconductor device having desired characteristics could not be manufactured.

DESCRIPTION OF REFERENCE NUMERALS

1. substrate
2. multilayer reflective film
3. protective film
4. phase shift film (thin film for pattern formation)

4a. phase shift pattern (thin film having transfer pattern)
5. conductive film
6. etching mask film
6a. etching mask pattern
8. resist film
8a. resist pattern
41. lower layer
41a. lower layer pattern
42. uppermost layer
42a. uppermost layer pattern
100. reflective mask blank
200. reflective mask

The invention claimed is:

1. A reflective mask blank comprising a multilayer reflective film and a thin film for pattern formation in this order on a main surface of a substrate,
wherein the thin film consists of a single layer structure consisting of a ruthenium-containing layer at least containing ruthenium, chromium, nitrogen, and oxygen, or a multilayer structure containing the ruthenium-containing layer,
wherein the ruthenium-containing layer is microcrystalline or amorphous, and when the ruthenium-containing layer is subjected to an analysis by an In-Plane measurement of an X-ray diffraction method to obtain an X-ray diffraction profile where, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg is greater than 1.0 and less than 3.0, and
wherein the thin film is a phase shift film.

2. The reflective mask blank according to claim 1, wherein the ruthenium- containing layer has more nitrogen content than oxygen content.

3. The reflective mask blank according to claim 2, wherein an element having the largest content in the ruthenium-containing layer is ruthenium.

4. The reflective mask blank according to claim 3, wherein the thin film consists of a multilayer structure comprising an uppermost layer containing ruthenium on the ruthenium-containing layer.

5. The reflective mask blank according to claim 4, wherein an element having the largest content in the uppermost layer is oxygen.

6. The reflective mask blank according to claim 5 comprising a protective film between the multilayer reflective film and the thin film.

7. The reflective mask blank according to claim 1, wherein an element having the largest content in the ruthenium-containing layer is ruthenium.

8. The reflective mask blank according to claim 1, wherein the thin film consists of a multilayer structure comprising an uppermost layer containing ruthenium on the ruthenium-containing layer.

9. The reflective mask blank according to claim 8, wherein an element having the largest content in the uppermost layer is oxygen.

10. The reflective mask blank according to claim 1 comprising a protective film between the multilayer reflective film and the thin film.

11. The reflective mask blank according to claim 1, wherein the thin film is the multilayer structure containing the ruthenium-containing layer, wherein the multilayer structure comprises a lower layer and an uppermost layer, wherein the lower layer contains ruthenium, chromium, nitrogen, and oxygen and the uppermost layer contains ruthenium, chromium, and oxygen.

12. A reflective mask comprising a multilayer reflective film and a thin film having a transfer pattern in this order on a main surface of a substrate,
wherein the thin film consists of a single layer structure consisting of a ruthenium-containing layer at least containing ruthenium, chromium, nitrogen, and oxygen, or a multilayer structure containing the ruthenium-containing layer,
wherein the ruthenium-containing layer is microcrystalline or amorphous, and when the ruthenium-containing layer is subjected to an analysis by an In-Plane measurement of an X-ray diffraction method to obtain an X-ray diffraction profile where, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg is greater than 1.0 and less than 3.0, and
wherein the thin film is a phase shift film.

13. The reflective mask according to claim 12, wherein the ruthenium-containing layer has more nitrogen content than oxygen content.

14. The reflective mask according to claim 12, wherein an element having the largest content in the ruthenium-containing layer is ruthenium.

15. The reflective mask according to claim 12, wherein the thin film consists of a multilayer structure comprising an uppermost layer containing ruthenium on the ruthenium-containing layer.

16. The reflective mask according to claim 15, wherein an element having the largest content in the uppermost layer is oxygen.

17. The reflective mask according to claim 12 comprising a protective film between the multilayer reflective film and the thin film.

18. A method of manufacturing a semiconductor device comprising the step of transferring a transfer pattern to a resist film on a semiconductor substrate by exposure using the reflective mask according to claim 12.

19. A reflective mask blank comprising a multilayer reflective film and a thin film for pattern formation in this order on a main surface of a substrate,
wherein the thin film consists of a multilayer structure containing a ruthenium-containing layer at least containing ruthenium, nitrogen, and oxygen,
wherein the ruthenium-containing layer is microcrystalline or amorphous, and when the ruthenium-containing layer is subjected to an analysis by an In-Plane measurement of an X-ray diffraction method to obtain an X-ray diffraction profile where, provided I_P1 is the maximum value of diffraction intensity within a diffraction angle 2θ ranging from 65 degrees to 75 degrees and I_avg is the average value of diffraction intensity within a diffraction angle 2θ ranging from 55 degrees to 65 degrees, I_P1/I_avg is greater than 1.0 and less than 3.0, and
wherein the thin film is a phase shift film,
wherein the multilayer structure comprises a lower layer and an uppermost layer, wherein the lower layer contains ruthenium, nitrogen, and oxygen and the uppermost layer contains ruthenium, chromium, and oxygen.

* * * * *